(12) United States Patent
Ding et al.

(10) Patent No.: US 11,876,038 B2
(45) Date of Patent: Jan. 16, 2024

(54) SEMICONDUCTOR DEVICE

(71) Applicant: Samsung Electronics Co., Ltd., Suwon-si (KR)

(72) Inventors: Shaofeng Ding, Suwon-si (KR); Jeong Hoon Ahn, Seongnam-si (KR); Yun Ki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 17/469,387

(22) Filed: Sep. 8, 2021

(65) Prior Publication Data
US 2022/0278024 A1  Sep. 1, 2022

(30) Foreign Application Priority Data
Feb. 26, 2021 (KR) ........................ 10-2021-0026926

(51) Int. Cl.
*H01L 23/48* (2006.01)
*H01L 23/522* (2006.01)
*H01L 23/528* (2006.01)
*H01L 23/00* (2006.01)
*H01L 25/18* (2023.01)

(52) U.S. Cl.
CPC ........ *H01L 23/481* (2013.01); *H01L 23/5226* (2013.01); *H01L 23/5283* (2013.01); *H01L 24/06* (2013.01); *H01L 25/18* (2013.01); *H01L 2224/0401* (2013.01); *H01L 2224/06182* (2013.01)

(58) Field of Classification Search
CPC ....... H01L 23/00; H01L 23/48; H01L 23/481; H01L 23/522; H01L 23/528; H01L 23/5226; H01L 23/5283; H01L 25/18; H01L 24/05; H01L 24/06; H01L 24/13; H01L 21/768; H01L 21/76816; H01L 21/76898; H01L 2224/05025; H01L 2224/05096; H01L 2224/13023; H01L 2224/16145; H01L 2224/16146; H01L 2224/16225; H01L 2225/06517; H01L 2225/06541; H01L 2225/06513
USPC ........................................................ 257/624
See application file for complete search history.

(56) References Cited

U.S. PATENT DOCUMENTS 8,426,946 B2  4/2013  Sasaki et al.
9,466,562 B2  10/2016  Nakazawa et al.
(Continued)

*Primary Examiner* — Chuong A Luu
(74) *Attorney, Agent, or Firm* — Muir Patent Law, PLLC

(57) ABSTRACT

A semiconductor device includes a substrate provided with an integrated circuit and a contact, an interlayer dielectric layer covering the integrated circuit and the contact, a through electrode penetrating the substrate and the interlayer dielectric layer, a first intermetal dielectric layer on the interlayer dielectric layer, and first and second wiring patterns in the first intermetal dielectric layer. The first wiring pattern includes a first conductive pattern on the through electrode, and a first via penetrating the first intermetal dielectric layer and connecting the first conductive pattern to the through electrode. The second wiring pattern includes a second conductive pattern on the contact, and a second via penetrating the first intermetal dielectric layer and connecting the second conductive pattern to the contact. A first width in a first direction of the first via is greater than a second width in the first direction of the second via.

11 Claims, 15 Drawing Sheets

(56) References Cited

U.S. PATENT DOCUMENTS

| | | | |
|---|---|---|---|
| 9,773,831 B1 | 9/2017 | Yang et al. | |
| 10,424,676 B2 | 9/2019 | Sasagawa et al. | |
| 2013/0313722 A1 | 11/2013 | Hwang et al. | |
| 2020/0066679 A1* | 2/2020 | Bohr | H01L 25/0655 |
| 2020/0185345 A1 | 6/2020 | Liao | |
| 2020/0343293 A1* | 10/2020 | Kawano | H01L 21/76849 |

* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0026926 filed on Feb. 26, 2021 in the Korean Intellectual Property Office, the disclosure of which is hereby incorporated by reference in its entirety.

BACKGROUND

The present inventive concepts relate to a semiconductor device, and more particularly, to a semiconductor device having a through electrode.

A reduction in size and design rule of a semiconductor device may be implemented by scaled-down transistors. The decrease in size of the transistors may reduce power consumption of the semiconductor device, improving operating characteristics of the semiconductor device. Accordingly, various research has been conducted to develop methods of fabricating semiconductor devices having superior performance while overcoming fabrication issues arising from high integration of the semiconductor devices.

A through electrode that penetrates a substrate has been proposed to electrically connect the semiconductor device to another semiconductor device or a printed circuit board. The through electrode may be used to achieve a three-dimensional mounting of multiple semiconductor devices and may accomplish a faster signal transfer speed compared with a conventional solder ball or solder bump. Accordingly, it is desirable to form through electrodes having electrical reliability.

SUMMARY

Some embodiments of the present inventive concepts provide a semiconductor device with improved electrical characteristics.

According to some embodiments of the present inventive concepts, a semiconductor device may comprise: a substrate provided with an integrated circuit and a contact electrically connected to the integrated circuit; an interlayer dielectric layer on the substrate, the interlayer dielectric layer covering the integrated circuit and the contact; a through electrode penetrating the substrate and the interlayer dielectric layer; a first intermetal dielectric layer on the interlayer dielectric layer; and a first wiring pattern and a second wiring pattern in the first intermetal dielectric layer. The first wiring pattern may include: a first conductive pattern on the through electrode; and a first via vertically penetrating the first intermetal dielectric layer and connecting the first conductive pattern to the through electrode. The second wiring pattern may include: a second conductive pattern on the contact; and a second via vertically penetrating the first intermetal dielectric layer and connecting the second conductive pattern to the contact. A first width, in a first direction, of the first via may be greater than a second width, in the first direction, of the second via. The first direction may be parallel to a top surface of the interlayer dielectric layer.

According to some embodiments of the present inventive concepts, a semiconductor device may comprise: a substrate that includes a first region and a second region; an integrated circuit provided at the first region of the substrate; an interlayer dielectric layer on the substrate; a contact on the first region, the contact penetrating the interlayer dielectric layer to connect with the integrated circuit; a through electrode at the second region, the through electrode penetrating the substrate and the interlayer dielectric layer; a capping layer on the substrate, the capping layer covering the integrated circuit and the contact; an intermetal dielectric layer on the capping layer; a first conductive pattern in the intermetal dielectric layer on the second region; and a plurality of first vias penetrating the intermetal dielectric layer and the capping layer and connecting the through electrode to the first conductive pattern, the first vias being arranged in a plurality of rows extending in a first direction and a plurality of columns extending in a second direction, the first and second directions intersecting each other and being parallel to a top surface of the substrate. Each of the first vias may have a bar shape that extends in the first direction. Each row is formed of at least two first vias arranged in the first direction. A sum of a width, in the first direction, of each of the at least two first vias in each row of the plurality of first vias may be equal to or less than a width, in the first direction, of a corresponding portion of the first conductive pattern. The at least two first vias contact the corresponding portion of the first conductive pattern contact.

According to some embodiments of the present inventive concepts, a semiconductor device may comprise: an integrated circuit provided at a substrate; an interlayer dielectric layer on the substrate; a contact penetrating the interlayer dielectric layer and being electrically connected to the integrated circuit; a through electrode penetrating the substrate and the interlayer dielectric layer; a plurality of wiring layers stacked on the interlayer dielectric layer; a first pad on the wiring layers; and a second pad on a bottom surface of the substrate and connected to the through electrode. Each of the wiring layers may include: a capping layer; an intermetal dielectric layer on the capping layer; a plurality of conductive patterns in the intermetal dielectric layer; a first via on the through electrode, the first via penetrating the capping layer and the intermetal dielectric layer to be connected to a first conductive pattern of the conductive patterns; and a second via on the contact, the second via penetrating the capping layer and the intermetal dielectric layer to be connected to a second conductive pattern of the conductive patterns. When viewed in a plan view, an aspect ratio of the first via may be greater than an aspect ratio of the second via.

DETAILED DESCRIPTION OF EMBODIMENTS

The following will now describe a semiconductor device according to the present inventive concepts with reference to the accompanying drawings.

Figure 1:
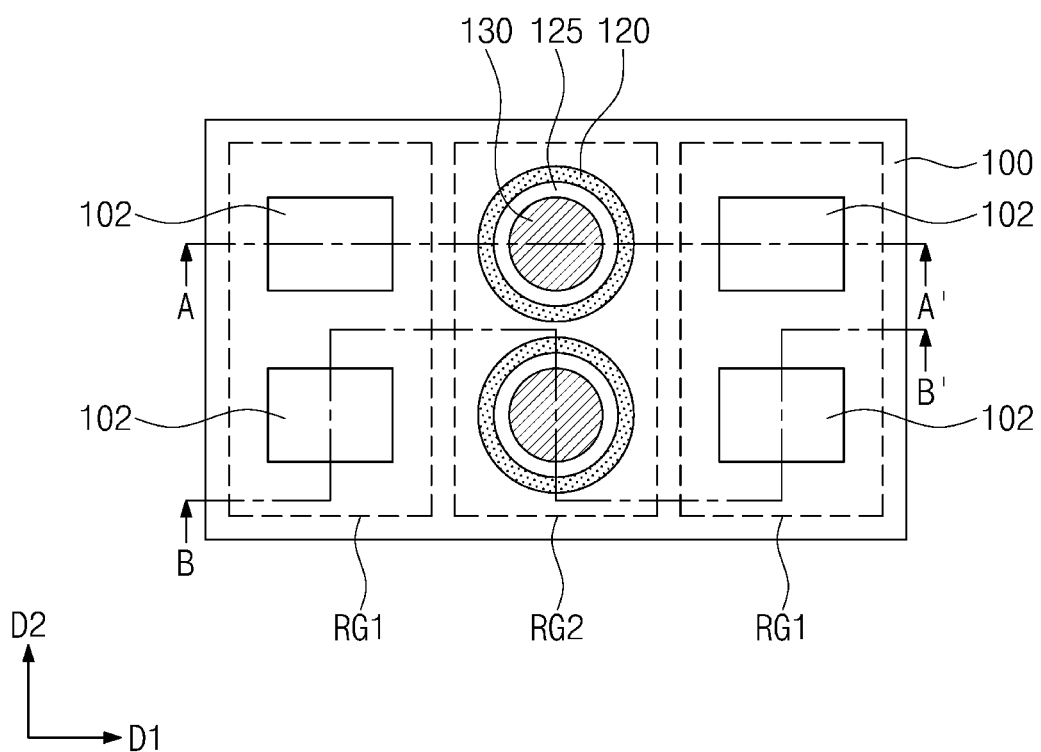
FIG. 1 illustrates a plan view showing a semiconductor device according to some example embodiments of the present inventive concepts.
Figure 2:
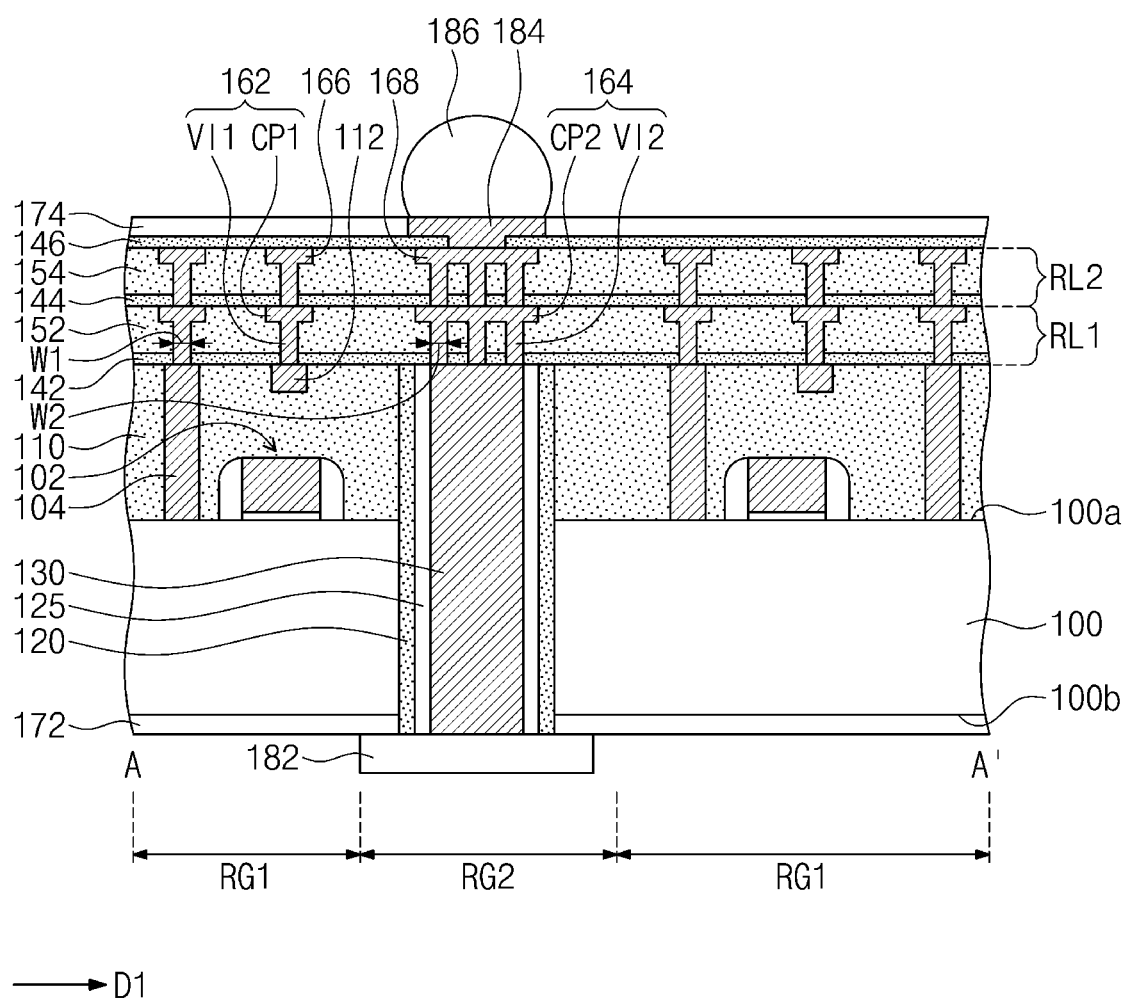
FIGS. 2 and 3 illustrate cross-sectional views showing a semiconductor device according to some example embodiments of the present inventive concepts.
Figure 3:
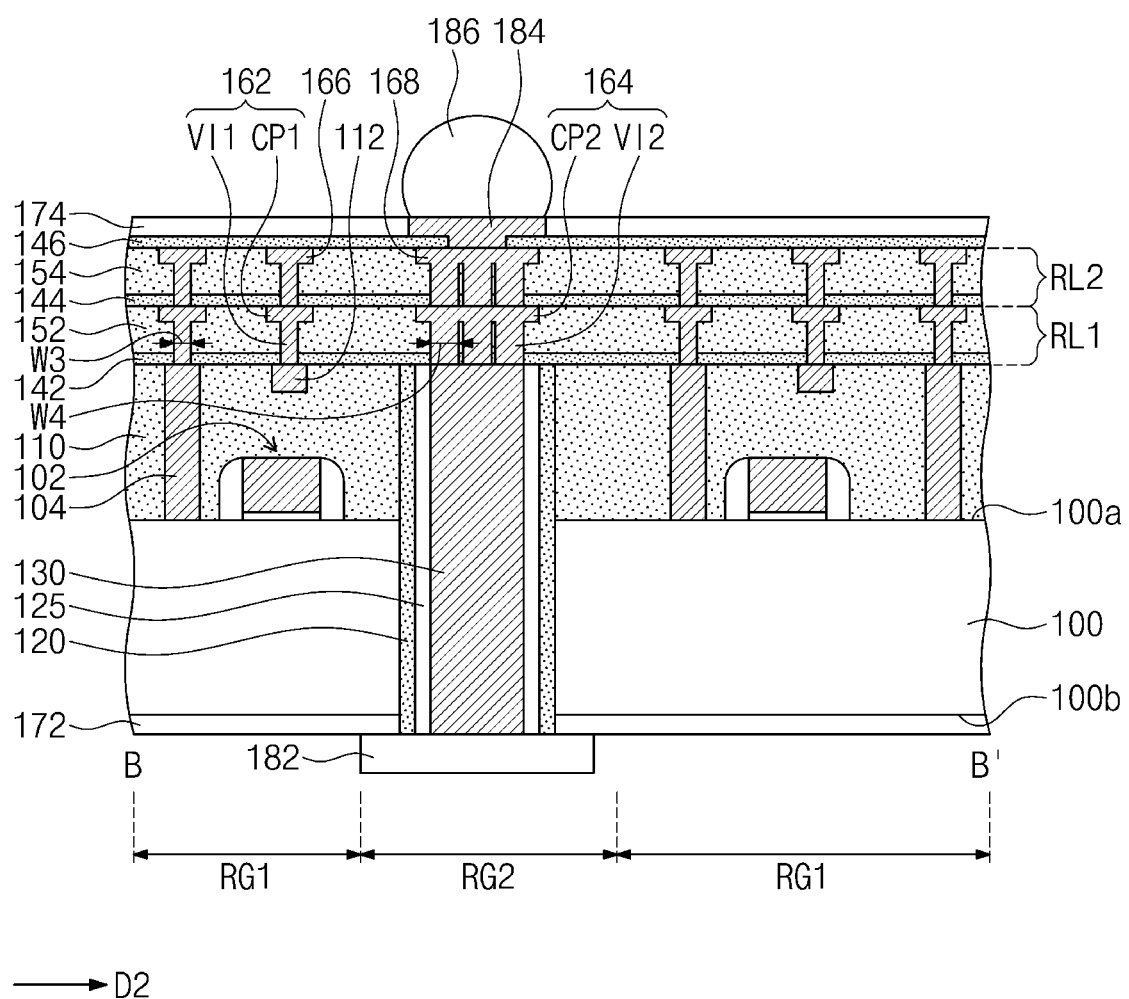
Figure 4:
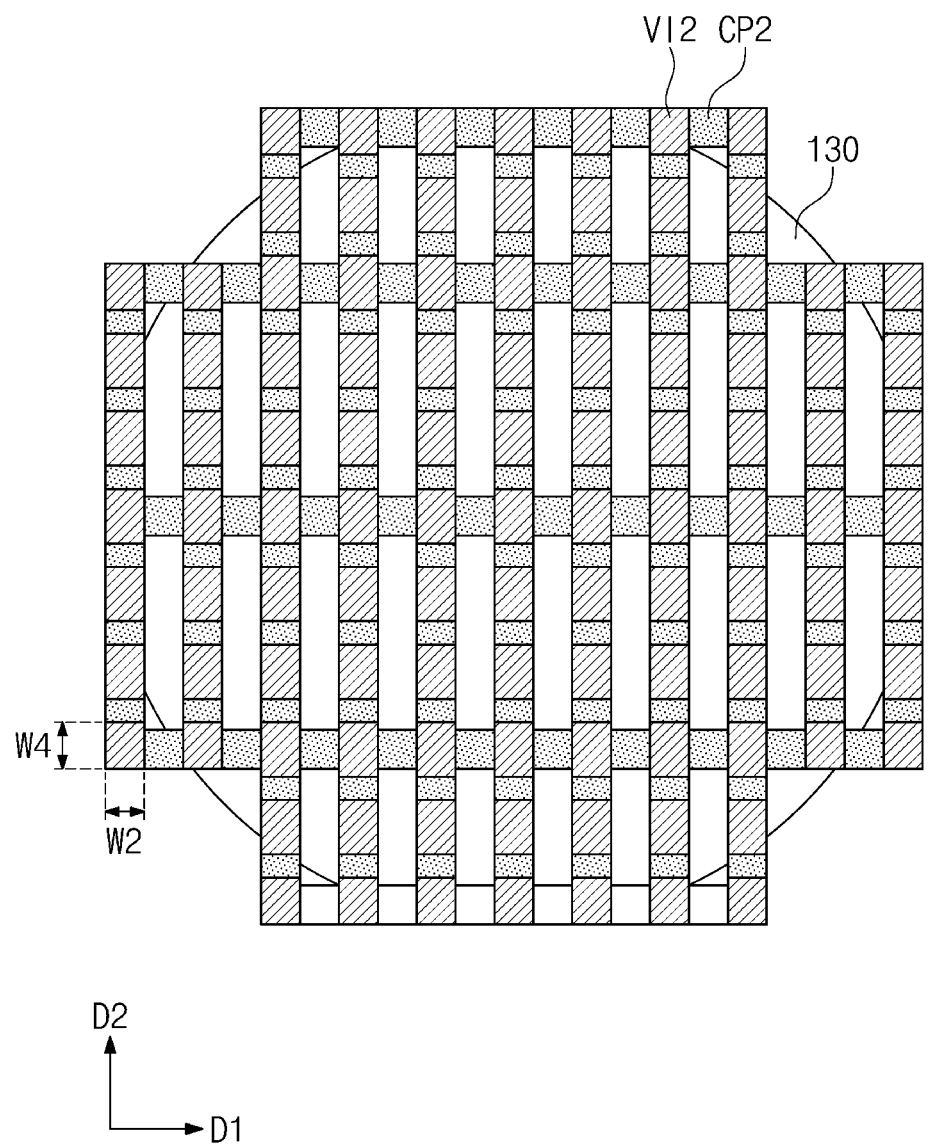
FIG. 4 illustrates an enlarged plan view showing arrangement of a through electrode and a wiring pattern depicted in FIGS. 1 to 3.

FIG. 1 illustrates a plan view showing a semiconductor device according to some example embodiments of the present inventive concepts. FIGS. 2 and 3 illustrate cross-sectional views showing a semiconductor device according to some example embodiments of the present inventive concepts. FIG. 2 corresponds to a cross-section taken along line A-A' of FIG. 1, and FIG. 3 corresponds to a cross-section taken along line B-B' of FIG. 1. FIG. 4 illustrates an enlarged plan view showing an arrangement of through electrodes and wiring patterns depicted in FIGS. 1 to 3.

Referring to FIGS. 1 to 3, a substrate 100 may be provided. The substrate 100 may have a top surface 100*a* and a bottom surface 100*b* opposite to the top surface 100*a*. The top surface 100*a* may be an active surface of the substrate 100, and the bottom surface 100*b* may be an inactive surface of the substrate 100. Transistors may be formed at the active surface of the substrate 100. The substrate 100 may be a compound semiconductor substrate or a semiconductor substrate including silicon (Si), germanium (Ge), or silicon-germanium (SiGe). For example, the substrate 100 may be a silicon substrate. The substrate 100 may have a first region RG1 and a second region RG2 that is positioned in a first direction D1 from the first region RG1. The first region RG1 may correspond to a region at which an integrated circuit 102 which will be discussed below is provided, and the second region RG2 may correspond to a region at which vertical connection of a semiconductor device to another semiconductor device is formed. As shown in FIGS. 1 to 3, another first region RG1 may be disposed in the first direction D1 from the second region RG2. However, the present inventive concepts are not limited thereto. The first region RG1 may be provided only on one side of the second region RG2. The following will focus on the embodiments of FIGS. 1 to 3.

An integrated circuit 102 may be provided at the top surface 100*a* of the substrate 100. The integrated circuit 102 may be positioned at the first region RG1 of the substrate 100. The integrated circuit 102 may include a memory circuit, a logic circuit, or a combination thereof. FIG. 2 depicts by way of example that the integrate circuit 102 is a planar transistor, but the present inventive concepts are not limited thereto. The integrated circuit 102 may include a gate-all-around (GAA) type transistor or a vertical transistor, and may further include various passive elements such as resistor and capacitor.

An interlayer dielectric layer 110 may be provided on the substrate 100. On the top surface 100*a* of the substrate 100, the interlayer dielectric layer 110 may cover components of the integrated circuit 102. For example, the integrated circuit 102 may be buried by the interlayer dielectric layer 110. The interlayer dielectric layer 110 may include or may be formed of a silicon oxide (SiO) layer or a silicon nitride (SiN) layer. For example, the interlayer dielectric layer 110 may include or may be formed of a tetraethyl orthosilicate (TEOS) oxide layer formed by chemical vapor deposition (CVD).

One or more contacts 104 may be provided in the interlayer dielectric layer 110. The contacts 104 may be positioned on the first region RG1. The contacts 104 may vertically penetrate the interlayer dielectric layer 110 to contact the top surface 100*a* of the substrate 100, and may have electrical connection with the substrate 100 or the integrated circuit 102. For example, when the integrated circuit 102 includes transistors, the contacts 104 may be connected to sources or drains of the transistors. The contacts 104 may include or may be formed of metal, such as copper (Cu), tungsten (W), aluminum (Al), and any combination thereof. FIGS. 2 and 3 depict by way of example that each of the contacts 104 is in the shape of one single pillar, but the present inventive concepts are not limited thereto. The contacts 104 may include a plurality of sub-contacts located at different levels and wiring lines each of which connects the sub-contacts with each other. The following will focus on the embodiments of FIGS. 2 and 3.

An internal wiring pattern 112 may be provided in the interlayer dielectric layer 110. The internal wiring pattern 112 may be disposed in an upper portion of the interlayer dielectric layer 110. For example, the internal wiring pattern 112 may be a line pattern formed by a damascene process that is performed on a top surface of the interlayer dielectric layer 110. The internal wiring pattern 112 may have a top surface coplanar with a top surface of the interlayer dielectric layer 110. The internal wiring pattern 112 may include or may be formed of metal, such as copper (Cu), tungsten (W), aluminum (Al), and any combination thereof. FIGS. 2 and 3 depict by way of example that the contacts 104 completely penetrates the interlayer dielectric layer 110 and are exposed at the top surface of the interlayer dielectric layer 110, but the present inventive concepts are not limited thereto. A portion of the internal wiring pattern 112 may be positioned on one or more contacts 104, and the contacts 104 may extend from a bottom surface of the internal wiring pattern 112 toward a bottom surface of the interlayer dielectric layer 110. The following will focus on the embodiments of FIGS. 2 and 3.

A through electrode 130 may be provided in the substrate 100 and the interlayer dielectric layer 110. The through electrode 130 may be positioned at the second region RG2 of the substrate 100. The through electrode 130 may vertically penetrate the substrate 100 and the interlayer dielectric layer 110. The through electrode 130 may have a pillar shape that vertically extends. The through electrode 130 may be spaced apart from each other at a certain distance from the integrated circuit 102, the contacts 104 and the internal wiring pattern 112. The through electrode 130 may have a bottom surface that is exposed at the bottom surface 100*b* of the substrate 100. The through electrode 130 may have a top surface that is exposed at the top surface of the interlayer dielectric layer 110. The through electrode 130 may include or may be formed of at least one metal, such as aluminum (Al), copper (Cu), tungsten (W), molybdenum (Mo), and cobalt (Co).

A barrier layer 125 may be provided on an outer sidewall of the through electrode 130. The barrier layer 125 may surround the through electrode 130. For example, the barrier layer 125 may surround the outer sidewall of the through electrode 130. The barrier layer 125 may prevent constituents (e.g., copper (Cu)) from diffusing from the through electrode 130 toward the substrate 100 or the integrated circuit 102. The barrier layer may include or may be formed of a metal nitride layer or a multiple layer including a metal layer and a metal nitride layer. The metal nitride layer may include or may be formed of at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A dielectric layer 120 may be interposed between the through electrode 130 and the interlayer dielectric layer 110 and between the through electrode 130 and the substrate 100. The dielectric layer 120 may surround an outer sidewall of the barrier layer 125. The dielectric layer 120 may separate the through electrode 130 and the barrier layer 125 from the substrate 100 and the interlayer dielectric layer 110.

A lower passivation layer 172 may be provided below the substrate 100. The lower passivation layer 172 may cover the bottom surface 100b of the substrate 100. The lower passivation layer 172 may expose the bottom surface of the through electrode 130. For example, the through electrode 130 may vertically penetrate the interlayer dielectric layer 110, the substrate 100, and the lower passivation layer 172.

A lower pad 182 may be provided below the lower passivation layer 172. The lower passivation layer 172 may be provided on its bottom surface with the lower pad 182 that covers the bottom surface of the through electrode 130. The lower pad 182 may be electrically connected to the through electrode 130. FIGS. 2 and 3 depict by way of example that the lower pad 182 is in the shape of a pad, but the present inventive concepts are not limited thereto. The lower pad 182 may be shaped like a solder ball coupled to the through electrode 130. The following will focus on the embodiments of FIGS. 2 and 3.

One or more wiring layers RL1 and RL2 may be provided on the interlayer dielectric layer 110. The wiring layers RL1 and RL2 may be sequentially stacked on the top surface of the interlayer dielectric layer 110. FIGS. 2 and 3 depict that two wiring layers RL1 and RL2 are provided, but the present inventive concepts are not limited thereto. One or at least three wiring layers may be provided based on integration or line density. The following will focus on the embodiments of FIGS. 2 and 3. The wiring layers RL1 and RL2 may include capping layers 142 and 144, intermetal dielectric layers 152 and 154, and wiring patterns 162, 164, 166, and 168.

A first wiring layer RL1 may have a first capping layer 142, a first intermetal dielectric layer 152, a first wiring pattern 162, and a second wiring pattern 164.

The first capping layer 142 may be provided on the interlayer dielectric layer 110. The first capping layer 142 may cover the top surface of the interlayer dielectric layer 110, top surfaces of the contacts 104, the top surface of the internal wiring pattern 112, and the top surface of the through electrode 130. The first capping layer 142 may include or may be formed of a silicon nitride (SiN) layer. Alternatively, the first capping layer 142 may include or may be formed of a dielectric material (e.g., silicon carbonitride (SiCN)) having a low dielectric constant that can prevent diffusion of metallic components included in the contacts 104, the internal wiring pattern 112, and/or the through electrode 130.

The first intermetal dielectric layer 152 may be provided on the first capping layer 142. The first intermetal dielectric layer 152 may cover a top surface of the first capping layer 142. The first intermetal dielectric layer 152 may include or may be formed of a silicon oxide (SiO) layer or a silicon nitride (SiN) layer. For example, the first intermetal dielectric layer 152 may include or may be formed of a tetraethyl orthosilicate (TEOS) oxide layer formed by chemical vapor deposition (CVD).

The first wiring pattern 162 and the second wiring pattern 164 may be provided in the first intermetal dielectric layer 152. The first wiring pattern 162 may be positioned on the first region RG1 of the substrate 100, and the second wiring pattern 164 may be positioned on the second region RG2 of the substrate 100. The first wiring pattern 162 may penetrate the first intermetal dielectric layer 152 and the first capping layer 142, and may contact the contact 104 and the internal wiring pattern 112. The second wiring pattern 164 may penetrate the first intermetal dielectric layer 152 and the first capping layer 142, and may contact the through electrode 130. The first wiring pattern 162 and the second wiring pattern 164 may include or may be formed of metal, such as copper (Cu), tungsten (W), aluminum (Al), and any combination thereof. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to, or "directly disposed on" another element, or as "contacting" or "in contact with" another element, there are no intervening elements present at the point of contact.

Referring to FIGS. 2 to 4, the first and second wiring patterns 162 and 164 may each have a damascene structure. For example, the first wiring pattern 162 may include a first conductive pattern CP1 that constitutes a horizontal redistribution layer in the first intermetal dielectric layer 152 on the first region RG1, and may also include a first via VI1 that vertically penetrates the first intermetal dielectric layer 152 and the first capping layer 142 and has connection with a bottom surface of the first conductive pattern CP1. The first via VI1 may penetrate the first intermetal dielectric layer 152 and the first capping layer 142, and may connect the first conductive pattern CP1 to the contact 104 or the internal wiring pattern 112. For example, the second wiring pattern 164 may include a second conductive pattern CP2 that constitutes a horizontal redistribution layer in the first intermetal dielectric layer 152 on the second region RG2, and may also include a second via VI2 that vertically penetrates the first intermetal dielectric layer 152 and the first capping layer 142 and has connection with a bottom surface of the second conductive pattern CP2. The second via VI2 may penetrate the first intermetal dielectric layer 152 and the first capping layer 142, and may connect the second conductive pattern CP2 to the through electrode 130.

The first via VI1 may have a circular shape when viewed in a plan view. For example, a first width w1 in the first direction D1 of the first via VI1 may be substantially the same as a third width w3 in a second direction D2 of the first via VI1. For example, when viewed in a plan view, an aspect ratio of the first via VI1 may reach substantially near one. The aspect ratio of the first via VI1 is a ratio of the third width w3, in the second direction D2, of the first via VI1 to the first width w1, in the first direction, of the first via VI1. The first via VI1 may have a cylindrical shape that penetrates the first intermetal dielectric layer 152 and the first capping layer 142. Terms such as "same," "equal," "planar,"

or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

When viewed in a plan view, the second via VI2 may have a bar shape that extends in the second direction D2. For example, a fourth width w4 in the second direction D2 of the second via VI2 may be greater than a second width w2 in the first direction D1 of the second via VI2. The fourth width w4 of the second via VI2 may be about 2 times to about 100 times the second width w2 of the second via VI2. For example, when viewed in a plan view, an aspect ratio of the second via VI2 may range from about 2 to about 100. With this aspect ratio of the second via VI2, the plurality of second vias VI2 and the second conductive pattern CP2 may have therebetween a large contact area, thereby having a low contact resistance. As a result, a semiconductor device may improve in electrical characteristics (e.g., a lower contact resistance). The aspect ratio of the second via VI2 is a ratio of the fourth width w4, in the second direction D2, to the second width w2, in the first direction D1. The aspect ratio of the second via VI2 may be greater than the aspect ratio of the first via VI1. The second width w2 of the second via VI2 may be about 1 times to about 3 times the first width w1 of the first via VI1. Alternatively, the second width w2 of the second via VI2 may be substantially the same as the first width w1 of the first via VI1. The fourth width w4 of the second via VI2 may be greater than the third width w3 of the first via VI1. For example, the fourth width w4 of the second via VI2 may be about 1 times to about 50 times the third width w3 of the first via VI1. In some embodiments, the fourth width w4 of the second via VI2 may be about 2 times to about 50 times the third width w3 of the first via VI1. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first conductive pattern CP1 and the first via VI1 may be connected with each other. In some embodiments, the first conductive pattern CP1 and the first via VI1 may be an integrated single piece formed by a damascene process. The first conductive pattern CP1 may have a width greater than each of the first and third widths w1 and w3 of the first via VI1. For example, the first conductive pattern CP1 and the first via VI1 may be connected with each other, and the connected structure of the first conductive pattern CP1 and the first via VI1 may have a T-shaped cross-section. A top surface of the first conductive pattern CP1 may be exposed at a top surface of the first intermetal dielectric layer 152. The top surface of the first conductive pattern CP1 may be coplanar with the top surface of the first intermetal dielectric layer 152.

The second conductive pattern CP2 and the second via VI2 may be connected with each other. In some embodiments, the second conductive pattern CP2 and the second via VI2 may be an integrated single piece formed by a damascene process. The second conductive pattern CP2 may have a width greater than each of the second and fourth widths w2 and w4 of the second via VI2. A top surface of the second conductive pattern CP2 may be exposed at the top surface of the first intermetal dielectric layer 152. The top surface of the second conductive pattern CP2 may be coplanar with the top surface of the first intermetal dielectric layer 152.

According to some embodiments, the second via VI2 may be provided in plural. The plurality of second vias VI2 may be positioned between the second conductive pattern CP2 and the through electrode 130. The plurality of second vias VI2 may include a plurality of rows extending in the first direction D1 and a plurality of columns extending in the second direction D2. A sum of the fourth widths w4 of the second vias VI2 that are arranged in a single row extending in the second direction D2 may be equal to or less than a width in the second direction D2 of a corresponding first portion of the second conductive pattern CP2. The corresponding first portion of the second conductive pattern CP2 may extend in the second direction D2. In some embodiments, the second vias VI2 arranged in the single row may contact the corresponding first portion of the second conductive pattern CP2. The present inventive concepts are not limited thereto. In some embodiments, a row may refer to the second vias VI2 arranged in the first direction D1. A sum of the second widths w2 of the second vias VI2 that are arranged in the first direction D1 may be equal to or less than a width in the first direction D1 of a corresponding second portion of the second conductive pattern CP2. The corresponding second portion of the second conductive pattern CP2 may extend in the second direction D2. In some embodiments, the second vias VI2 arranged in the single row may contact the corresponding second portion of the second conductive pattern CP2.

When viewed in a plan view, the second conductive pattern CP2 may have a mesh shape that connects the plurality of second vias VI2 with each other. For example, when viewed in a plan view, the plurality of second vias VI2 may be positioned below intersections of the mesh-type second conductive patterns CP2 or may be positioned along the second direction D2 between intersections of the second conductive patterns CP2.

According to some embodiments of the present inventive concepts, a plurality of second vias VI2 may each have a fourth width w4 along an extending direction (e.g., the second direction D2) of the second conductive pattern CP2. Therefore, the plurality of second vias VI2 may have a wide cross-section and a low resistance. The plurality of second vias VI2 and the second conductive pattern CP2 may have therebetween a large contact area and a low contact resistance. As a result, a semiconductor device may improve in electrical characteristics (e.g., a lower contact resistance).

FIG. 4 depicts by way of example that each of the plurality of second vias VI2 has a bar shape that extends in the second direction D2, but the present inventive concepts are not limited thereto. Each of the plurality of second vias VI2 may have a bar shape that extends in the first direction D1.

Figure 5:
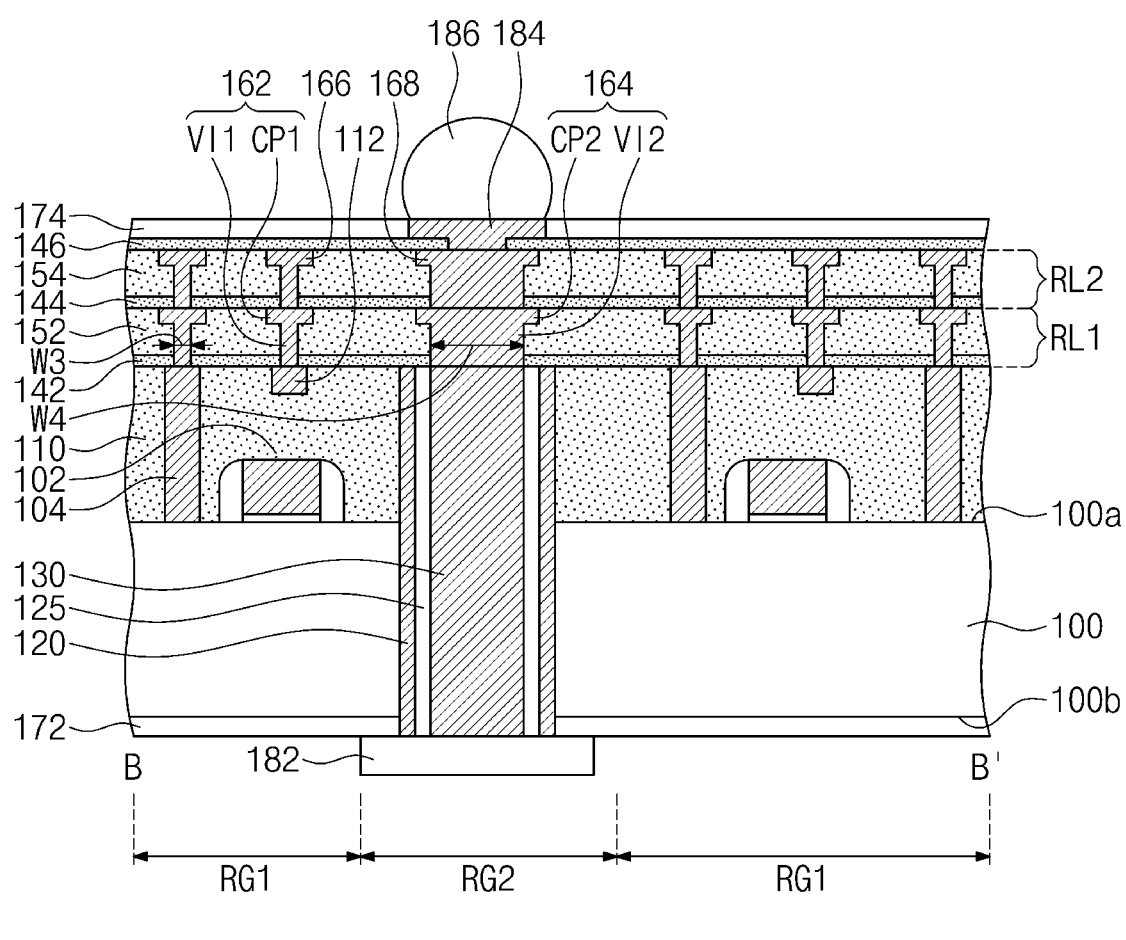
FIG. 5 illustrates a cross-sectional view showing a semiconductor device according to some example embodiments of the present inventive concepts.
Figure 6:
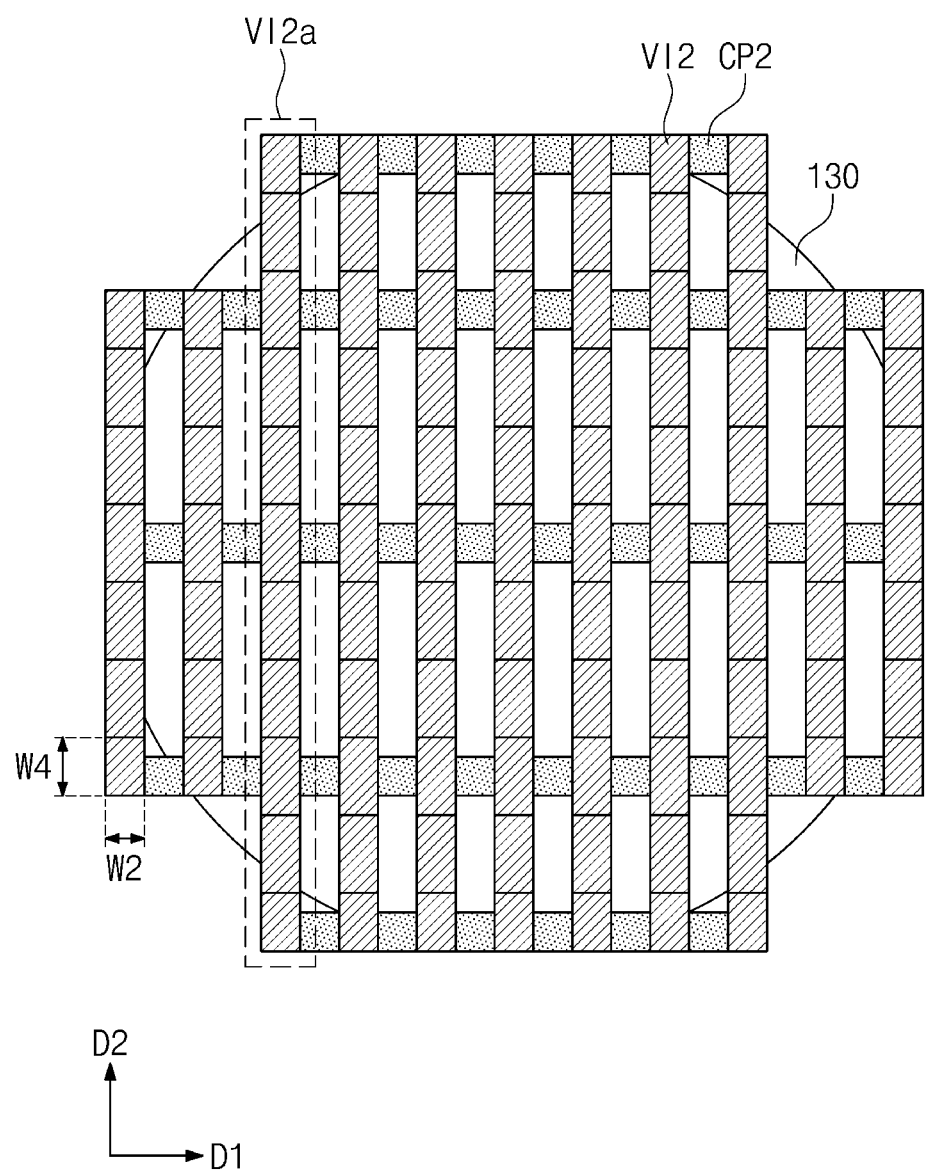
FIG. 6 illustrates an enlarged plan view showing arrangement of a through electrode and a wiring pattern depicted in FIG. 5.

According to some example embodiments, ones of the plurality of second vias VI2 may be connected to each other. FIG. 5 illustrates a cross-sectional view taken along line B-B' of FIG. 1, showing a semiconductor device according to some example embodiments of the present inventive concepts. FIG. 6 illustrates an enlarged plan view showing arrangement of a through electrode and a wiring pattern of FIG. 5. Referring to FIGS. 5 and 6, among the plurality of second vias VI2, ones arranged along the second direction D2 may be connected with each other. For example, the second vias VI2 arranged along the second direction D2 may be connected with each other to constitute a single consolidated via VI2a. Therefore, the second vias VI2 may include a plurality of consolidated vias VI2a which are arranged in the first direction D1 and which extend in the second direction D2. The consolidated vias VI2a may each have a width in the second direction D2 which is the same as or less than a width in the second direction D2 of the second conductive pattern CP2. Therefore, the plurality of second vias VI2 may each have a wide cross-section, and a large contact area may be provided between the plurality of second vias VI2 and the second conductive pattern CP2. As a result, a semiconductor device may improve in electrical characteristics (e.g., a lower contact resistance).

Referring back to FIGS. 1 to 4, a second wiring layer RL2 may have a similar configuration to that of the first wiring layer RL1. The second wiring layer RL2 may include a second capping layer 144, a second intermetal dielectric layer 154, a third wiring pattern 166, and a fourth wiring pattern 168.

The second capping layer 144 may be provided on the first intermetal dielectric layer 152 of the first wiring layer RL1. The second capping layer 144 may cover the top surface of the first intermetal dielectric layer 152, a top surface of the first wiring pattern 162, and a top surface of the second wiring pattern 164. The second capping layer 144 may include or may be formed of a silicon nitride (SiN) layer. Alternatively, the second capping layer 144 may include or may be formed of a dielectric material (e.g., silicon carbonitride (SiCN)) having a low dielectric constant that can prevent diffusion of metallic components included in the first wiring pattern 162 and/or the second wiring pattern 164.

The second intermetal dielectric layer 154 may be provided on the second capping layer 144. The second intermetal dielectric layer 154 may cover a top surface of the second capping layer 144. The second intermetal dielectric layer 154 may include or may be formed of a silicon oxide (SiO) layer or a silicon nitride (SiN) layer. For example, the second intermetal dielectric layer 154 may include or may be formed of a tetraethyl orthosilicate (TEOS) oxide layer formed by chemical vapor deposition (CVD).

The third wiring pattern 166 and the fourth wiring pattern 168 may be provided in the second intermetal dielectric layer 154. The third wiring pattern 166 may be positioned on the first region RG1 of the substrate 100, and the fourth wiring pattern 168 may be positioned on the second region RG2 of the substrate 100. The third wiring pattern 166 may penetrate the second intermetal dielectric layer 154 and the second capping layer 144, and may contact the first wiring pattern 162. The fourth wiring pattern 168 may penetrate the second intermetal dielectric layer 154 and the second capping layer 144, and may contact the second wiring pattern 164. The third wiring pattern 166 and the fourth wiring pattern 168 may include or may be formed of metal, such as copper (Cu), tungsten (W), aluminum (Al), and any combination thereof.

The third and fourth wiring patterns 166 and 168 may each have a damascene structure. For example, the third wiring pattern 166 may include a third conductive pattern that constitutes a horizontal redistribution layer in the second intermetal dielectric layer 154 on the first region RG1, and may also include a third via that vertically penetrates the second intermetal dielectric layer 154 and the second capping layer 144 and has connection with a bottom surface of the third conductive pattern. The third via may penetrate the second intermetal dielectric layer 154 and the second capping layer 144 to connect the third conductive pattern to the first conductive pattern CP1. For example, the fourth wiring pattern 168 may include a fourth conductive pattern that constitutes a horizontal redistribution layer in the second intermetal dielectric layer 154 on the second region RG2, and may also include a fourth via that vertically penetrates the second intermetal dielectric layer 154 and the second capping layer 144 and has connection with a bottom surface of the fourth conductive pattern. The second via may penetrate the second intermetal dielectric layer 154 and the second capping layer 144 to connect the fourth conductive pattern to the second conductive pattern CP2.

The fourth via may have a planar shape substantially the same as or similar to that of the second vias VI2. The planar shape of the fourth via may be a bar shape that extends in the second direction D2. For example, a width in the second direction D2 of the fourth via may be greater than a width in the first direction D1 of the fourth via. When viewed in a plan view, an aspect ratio of the fourth via may range from about 2 to about 100. The aspect ratio of the fourth via may be greater than the aspect ratio of the third via.

The fourth conductive pattern and the fourth via may be connected with each other. In some embodiments, the fourth conductive pattern and the fourth via may be an integrated single piece formed by a damascene process. A top surface of the fourth conductive pattern may be exposed at a top surface of the second intermetal dielectric layer 154. The top surface of the fourth conductive pattern may be coplanar with a top surface of the second intermetal dielectric layer 154.

According to some embodiments, the fourth via may be provided in plural. The plurality of fourth vias may be positioned between the fourth conductive pattern and the second conductive pattern CP2. A planar arrangement of the fourth vias may be the same as or similar to that of the second vias VI2. The plurality of fourth vias may be arranged in the first and second directions D1 and D2. A sum of widths of the fourth vias that are arranged in a single row along the second direction D2 may be the same as or less than a width in the second direction D2 of the fourth conductive pattern.

When viewed in a plan view, the fourth conductive pattern may have a mesh shape that connects the plurality of fourth vias with each other. For example, when viewed in a plan view, the plurality of fourth vias may be positioned below intersections of the mesh-type fourth conductive patterns or may be positioned along the second direction D2 between intersections of the fourth conductive patterns.

A third capping layer 146 may be provided on the second wiring layer RL3. The third capping layer 146 may cover the top surface of the second intermetal dielectric layer 154, a top surface of the third wiring pattern 166, and a top surface of the fourth wiring pattern 168. The third capping layer 146 may include or may be formed of a silicon nitride (SiN) layer. Alternatively, the third capping layer 146 may include or may be formed of a dielectric material (e.g., silicon carbonitride (SiCN)) having a low dielectric constant that can prevent diffusion of metallic components included in the third wiring pattern 166 and/or the fourth wiring pattern 168.

An upper passivation layer 174 may be provided on the third capping layer 146. The upper passivation layer 174 may cover a top surface of the third capping layer 146. The upper passivation layer 174 may include or may be formed of a dielectric material, such as a silicon oxide (SiO) layer, a silicon nitride (SiN) layer, and a polymer.

An upper pad 184 may be provided on the upper passivation layer 174. The upper pad 184 may be exposed at a top surface of the upper passivation layer 174, and may penetrate the third capping layer 146 for electrical connection with the fourth wiring pattern 168. FIGS. 2 and 3 depict by way of example that the upper pad 184 is in the shape of a pad, but the present inventive concepts are not limited thereto.

An upper terminal 186 may be provided on the upper pad 184. The upper terminal 186 may include a connection terminal such as a solder ball. For example, the upper terminal 186 may include or may be formed of lead-free solder.

Figure 7:
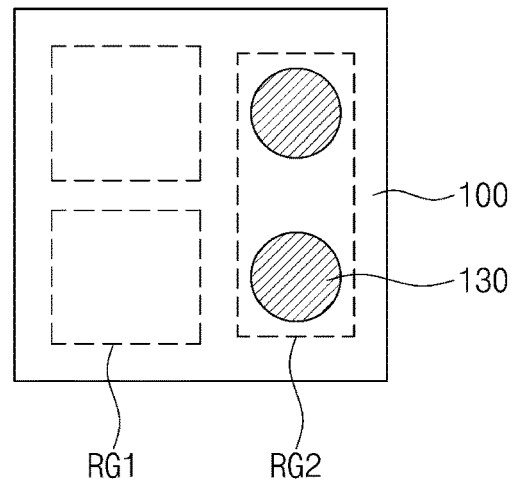
FIG. 7 illustrates a simplified plan view showing a semiconductor device according to some example embodiments of the present inventive concepts.

FIG. 7 illustrates a simplified plan view showing a semiconductor device according to some example embodiments of the present inventive concepts.

Referring to FIG. 7, a logic chip may be provided. The logic chip may include first regions RG1 of a substrate 100. For example, the first regions RG1 may be logic cell areas. The first regions RG1 may be two-dimensionally arranged on the substrate 100. Each of the first regions RG1 may be a zone at which logic cells that constitute a logic circuit are disposed. For example, the first regions RG1 depicted in FIG. 7 may each be a single logic cell. As used herein, the term "logic cell" may refer to a unit circuit configured to perform a single logical operation and be composed of a plurality of interconnected MOSFETs. Examples of logic cells include a NAND gate, a NOR gate, an inverter, and a latch. In addition, it will be apparent that the invention is not limited to one or a plurality of logic cells, but may be implemented in connection with one or more transistors, a portion of a transistor, an integrated circuit (e.g., comprising a plurality of interconnected logic cell), a semiconductor chip, a plurality of semiconductor chips (e.g., stacked in a package), etc.

The logic chip may further include a second region RG2 of the substrate 100. The second region RG2 may be adjacent to the first regions RG1. The second region RG2 may be a connection area. The first regions RG1 may be disposed on one side of the second region RG2 or may surround the second region RG2. At least one through electrode 130 may be provided at the second region RG2.

Figure 8:
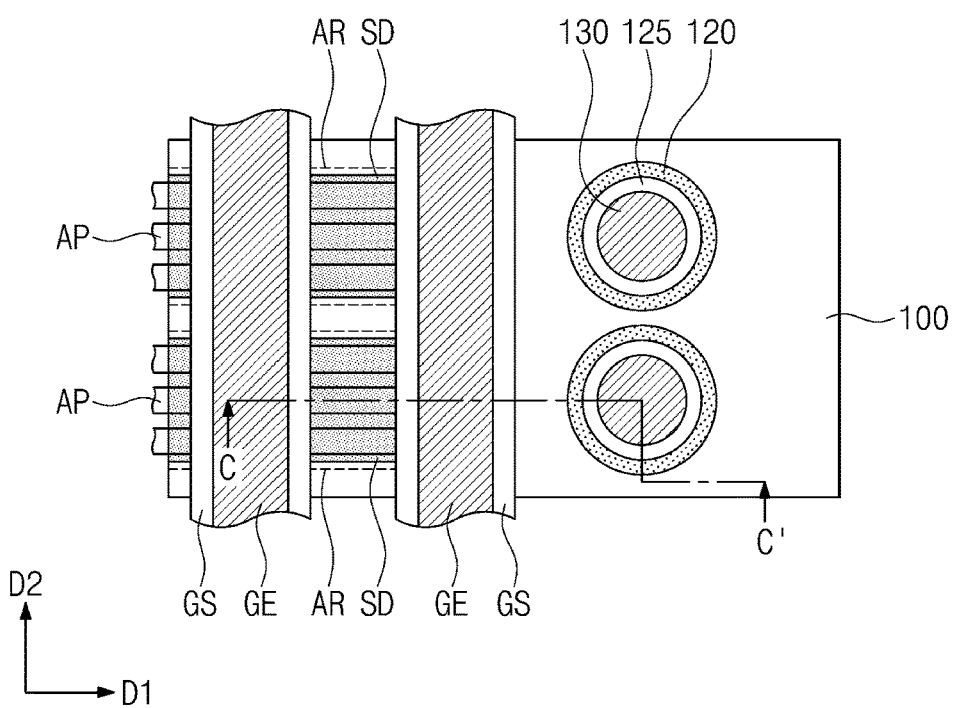
FIG. 8 illustrates an enlarged plan view showing first and second regions of FIG. 7.
Figure 9:
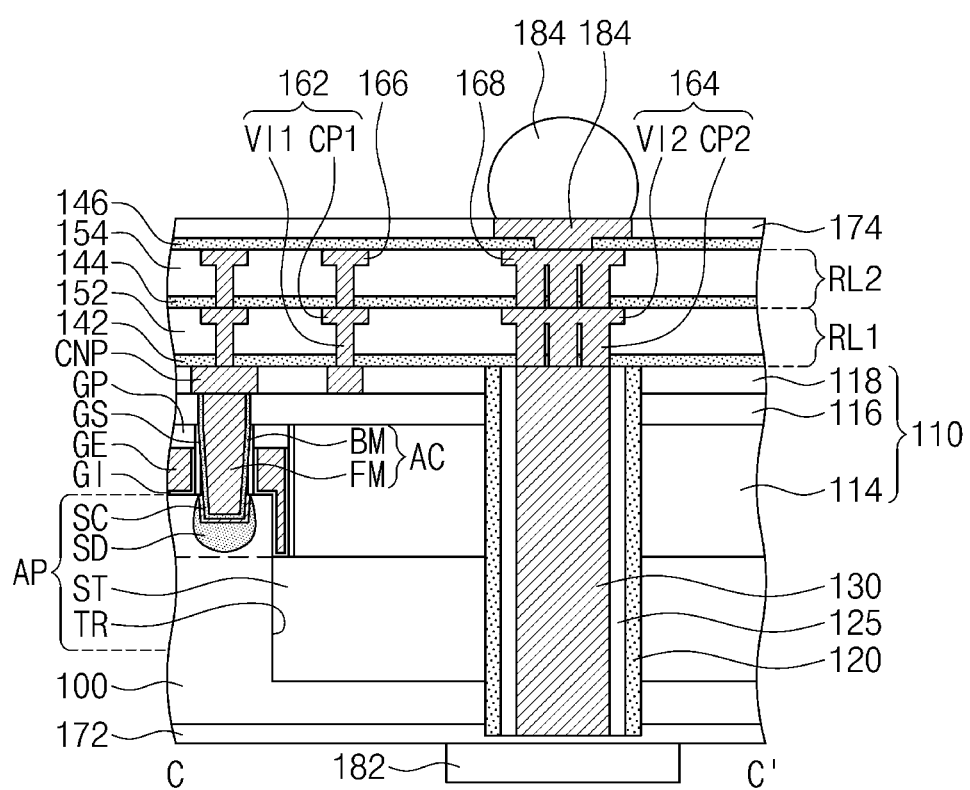
FIG. 9 illustrates a cross-sectional view showing a semiconductor device according to some example embodiments of the present inventive concepts.

FIG. 8 illustrates an enlarged plan view showing first and second regions of FIG. 7. FIG. 9 illustrates a cross-sectional view taken along line C-C' of FIG. 8, showing a semiconductor device according to some example embodiments of the present inventive concepts.

Referring to FIGS. 8 and 9, a substrate 100 may include active regions AR. For example, each of the active regions AR may be a P-type Metal Oxide Field Effect Transistor (PMOSFET) area or an N-type Metal Oxide Field Effect Transistor (NMOSFET) area. The substrate 100 may be a compound semiconductor substrate or a semiconductor substrate including silicon (Si), germanium (Ge), or silicon-germanium (SiGe). For example, the substrate 100 may be a silicon substrate.

The active regions AR may be defined on an upper portion of the substrate 100. The active regions AR may be spaced apart from each other in a second direction D2. Each of the active regions AR may extend in a first direction D1.

Active patterns AP may be provided at each of the active regions AR. The active patterns AP may extend parallel in the first direction D1. The active patterns AP may be vertically protruding portions of the substrate 100. Neighboring active patterns AP may be spaced apart from each other across a trench.

A device isolation layer ST may fill spaces between the active regions AR and spaces between the active patterns AP. For example, the device isolation layer ST may fill the trench that separates the neighboring active patterns AP from each other. The device isolation layer ST may include or may be formed of a silicon oxide (SiO) layer. The active patterns AP may have upper portions that vertically protrude upwardly from the device isolation layer ST. Each of the upper portions of the active patterns AP may have a fin-shape. The device isolation layer ST may not cover any of the upper portions of the active patterns AP. The device isolation layer ST may cover lower sidewalls of the active patterns AP.

Source/drain patterns SD may be provided on the upper portions of the active patterns AP. The source/drain patterns SD may be impurity-doped sections having a first conductivity type (e.g., p-type). A channel pattern may be interposed between a pair of source/drain patterns SD. The source/drain patterns SD may be epitaxial patterns formed by a selective epitaxial growth process. For example, the source/drain patterns SD may have their top surfaces coplanar with those of the channel patterns. In some embodiments, the source/drain patterns SD may have their top surfaces higher than those of the channel patterns.

Gate electrodes GE may be provided to extend in the second direction D2 while running across the active patterns AP. The gate electrodes GE may be arranged at a regular pitch along the first direction D1. The gate electrodes GE may vertically overlap the channel patterns. Each of the gate electrodes GE may surround a top surface and opposite sidewalls of each of the channel patterns.

A pair of gate spacers GS may be disposed on opposite sidewalls of each of the gate electrodes GE. The gate spacers GS may extend in the second direction D2 along the gate electrodes GE. The gate spacers GS may have their top surfaces higher than those of the gate electrodes GE. The top surfaces of the gate spacers GS may be coplanar with that of a first interlayer dielectric layer 114 which will be discussed below. The gate spacers GS may include or may be formed of at least one selected from silicon carbonitride (SiCN), silicon carbon oxynitride (SiCON), and silicon nitride (SiN).

A gate capping pattern GP may be provided on each of the gate electrodes GE. The gate capping pattern GP may extend in the second direction D2 along the gate electrode GE. The gate capping pattern GP may include or may be formed of a material having etch selectivity with respect to first and second interlayer dielectric layers 114 and 116 which will be discussed below. For example, the gate capping patterns GP may include or may be formed of at least one selected from silicon oxynitride (SiON), silicon carbonitride (SiCN), silicon carbon oxynitride (SiCON), and silicon nitride (SiN).

A gate dielectric layer GI may be provided between the gate electrode GE and the active pattern AP. The gate dielectric layer GI may extend along a bottom surface of the gate electrode GE positioned on the gate dielectric layer GI. The gate dielectric layer GI may cover a top surface of the device isolation layer ST below the gate electrode GE. The gate dielectric layer GI may include or may be formed of a high-k dielectric material whose dielectric constant is greater than that of a silicon oxide layer. For example, the high-k dielectric material may include hafnium oxide ($HfO_2$), hafnium zirconium oxide ($HfZrO_2$), zirconium oxide ($ZrO_2$), zirconium silicon oxide ($ZrSiO_4$), tantalum oxide (TaO), or titanium oxide (TiO).

A first interlayer dielectric layer 114 may be provided on the substrate 100. The first interlayer dielectric layer 114 may cover the gate spacers GS and the source/drain patterns SD. The first interlayer dielectric layer 114 may have a top surface substantially coplanar with those of the gate capping patterns GP and those of the gate spacers GS. The first interlayer dielectric layer 114 may be provided thereon with a second interlayer dielectric layer 116 that covers the gate capping patterns GP. A third interlayer dielectric layer 118 may be provided on the second interlayer dielectric layer 116. The first, second, and third interlayer dielectric layers 114, 116, and 118 may include or may be formed of a silicon oxide layer. The first, second, and third interlayer dielectric layers 114, 116, and 118 may constitute a single interlayer dielectric layer 110.

Active contacts AC may be provided to penetrate the first and second interlayer dielectric layers 114 and 116 and to have electrical connection with corresponding source/drain patterns SD. Each of the active contacts AC may be provided between a pair of gate electrodes GE. The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

The active contact AC may include a conductive pattern FM and a barrier pattern BM that surrounds the conductive pattern FM. The barrier pattern BM may cover sidewalls and a bottom surface of the conductive pattern FM. The conductive pattern FM may include or may be formed of at least one metal selected from aluminum, copper, tungsten, molybdenum, and cobalt. The barrier pattern BM may include or may be formed of a metal nitride layer or a combination of a metal layer and a metal nitride layer. The metal layer may include or may be formed of at least one selected from titanium, tantalum, tungsten, nickel, cobalt, and platinum. The metal nitride layer may include or may be formed of at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A silicide pattern SC may be interposed between the active contact AC and the source/drain pattern SD. The active contact AC may be electrically connected through the silicide pattern SC to the source/drain region SD. The silicide pattern SC may include or may be formed of metal silicide. For example, the silicide pattern SC may include or may be formed of at least one selected from titanium silicide, tantalum silicide, tungsten silicide, nickel silicide, and cobalt silicide.

Connection patterns CNP may be provided in the third interlayer dielectric layer 118. The connection patterns CNP may be provided on the active contacts AC. The connection patterns CNP may be connected to the active contacts AC. Although not shown, each of the connection patterns CNP may include a conductive pattern and a barrier pattern. The conductive pattern may include or may be formed of metal which is the same as or different from that of the conductive pattern FM included in the active contact AC.

A through electrode 130 may be provided in the substrate 100 and the interlayer dielectric layer 110. The through electrode 130 may be positioned at the second region RG2 of the substrate 100. The through electrode 130 may vertically penetrate the substrate 100, the device isolation layer ST, and the interlayer dielectric layer 110. The through electrode 130 may have a pillar shape that vertically extends. A bottom surface of the through electrode 130 may be exposed at a bottom surface of the substrate 100. A top surface of the through electrode 130 may be exposed at a top surface of the interlayer dielectric layer 110.

A barrier layer 125 may be provided on an outer sidewall of the through electrode 130. The barrier layer 125 may surround the through electrode 130. For example, the barrier layer 125 may surround the outer sidewall of the through electrode 130.

A dielectric layer 120 may be interposed between the through electrode 130 and the interlayer dielectric layer 110 and between the through electrode 130 and the substrate 100. The dielectric layer 120 may surround an outer sidewall of the barrier layer 125. The dielectric layer 120 may separate the through electrode 130 and the barrier layer 125 from the substrate 100 and the interlayer dielectric layer 110.

A lower passivation layer 172 may be provided below the substrate 100. The lower passivation layer 172 may cover the bottom surface of the substrate 100. The lower passivation layer 172 may expose the bottom surface of the through electrode 130.

A lower pad 182 may be provided below the lower passivation layer 172. The lower passivation layer 172 may be provided on a bottom surface with the lower pad 182 that covers the bottom surface of the through electrode 130. The lower pad 182 may be electrically connected to the through electrode 130.

One or more wiring layers RL1 and RL2 may be provided on the interlayer dielectric layer 110. The wiring layers RL1 and RL2 may be sequentially stacked on the top surface of the interlayer dielectric layer 110.

A first wiring layer RL1 may have a first capping layer 142, a first intermetal dielectric layer 152, a first wiring pattern 162, and a second wiring pattern 164.

The first capping layer 142 may be provided on the interlayer dielectric layer 110. The first capping layer 142 may cover the top surface of the interlayer dielectric layer 110, top surfaces of the connection patterns CNP, and the top surface of the through electrode 130.

The first intermetal dielectric layer 152 may be provided on the first capping layer 142. The first intermetal dielectric layer 152 may cover a top surface of the first capping layer 142.

The first wiring pattern 162 and the second wiring pattern 164 may be provided in the first intermetal dielectric layer 152. The first wiring pattern 162 may penetrate the first intermetal dielectric layer 152 and the first capping layer 142, and may contact the connection pattern CNP. The second wiring pattern 164 may penetrate the first intermetal dielectric layer 152 and the first capping layer 142, and may contact the through electrode 130.

The first wiring pattern 162 may include a first conductive pattern CP1 that constitutes a horizontal redistribution layer in the first intermetal dielectric layer 152, and may also include a first via VI1 that vertically penetrates the first intermetal dielectric layer 152 and the first capping layer 142 and has connection with a bottom surface of the first conductive pattern CP1. The second wiring pattern 164 may include a second conductive pattern CP2 that constitutes a horizontal redistribution layer in the first intermetal dielectric layer 152, and may also include a second via VI2 that vertically penetrates the first intermetal dielectric layer 152 and the first capping layer 142 and has connection with a bottom surface of the second conductive pattern CP2.

A planar shape of the second via VI2 may be a bar shape that extends in the second direction D2. For example, a width in the second direction D2 of the second via VI2 may be greater than a width in the first direction D1 of the second via VI2. An aspect ratio of the second via VI2 may be greater than an aspect ratio of the first via VI1.

According to some embodiments, the second via VI2 may be provided in plural. The plurality of second vias VI2 may be positioned between the second conductive pattern CP2 and the through electrode 130. The plurality of second vias VI2 may be arranged in the first and second directions D1 and D2. When viewed in a plan view, the second conductive pattern CP2 may have a mesh shape that connects the plurality of second vias VI2 with each other. For example, when viewed in a plan view, a plurality of second vias VI2 may be positioned below intersections of the mesh-type second conductive patterns CP2 or may be positioned along the second direction D2 between intersections of the second conductive patterns CP2.

A second wiring layer RL2 may have a similar configuration to that of the first wiring layer RL1. The second wiring layer RL2 may include a second capping layer 144, a second intermetal dielectric layer 154, a third wiring pattern 166, and a fourth wiring pattern 168.

The second capping layer 144 may be provided on the first intermetal dielectric layer 152 of the first wiring layer RL1. The second capping layer 144 may cover a top surface of the first intermetal dielectric layer 152, a top surface of the first wiring pattern 162, and a top surface of the second wiring pattern 164.

The second intermetal dielectric layer 154 may be provided on the second capping layer 144. The second intermetal dielectric layer 154 may cover a top surface of the second capping layer 144.

The third wiring pattern 166 and the fourth wiring pattern 168 may be provided in the second intermetal dielectric layer 154. The third wiring pattern 166 may penetrate the second intermetal dielectric layer 154 and the second capping layer 144, and may contact the first wiring pattern 162. The fourth wiring pattern 168 may penetrate the second intermetal dielectric layer 154 and the second capping layer 144, and may contact the second wiring pattern 164.

A third capping layer 146 may be provided on the second wiring layer RL3. The third capping layer 146 may cover a top surface of the second intermetal dielectric layer 154, a top surface of the third wiring pattern 166, and a top surface of the fourth wiring pattern 168.

An upper passivation layer 174 may be provided on the third capping layer 146. The upper passivation layer 174 may cover a top surface of the third capping layer 146.

An upper pad 184 may be provided on the upper passivation layer 174. The upper pad 184 may be exposed at a top surface of the upper passivation layer 174, and may penetrate the third capping layer 146 for electrical connection with the fourth wiring pattern 168.

An upper terminal 186 may be provided on the upper pad 184. The upper terminal 186 may include or may be formed of a connection terminal such as a solder ball.

Figure 10:
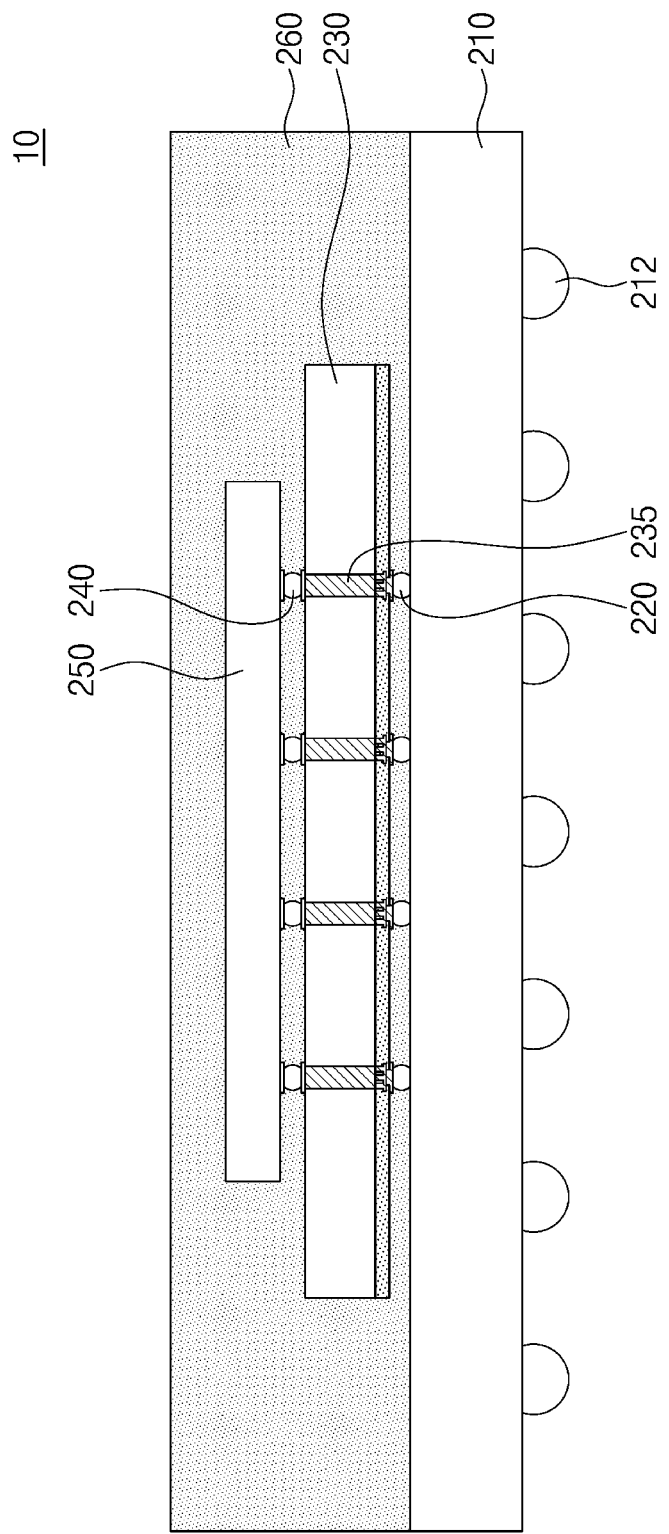
FIG. 10 illustrates a cross-sectional view showing a semiconductor package including a semiconductor device according to some example embodiments of the present inventive concepts.

FIG. 10 illustrates a cross-sectional view showing a semiconductor package including a semiconductor device according to some example embodiments of the present inventive concepts.

Referring to FIG. 10, a semiconductor package 10 may include a package substrate 210 such as a printed circuit board having an external terminal 212 attached thereto, an application processor 230 mounted on the package substrate 210, a memory chip 250 stacked on the application processor 230, and a mold layer 260 that covers the application processor 230 and the memory chip 250. The semiconductor package 10 may be used for mobile products such as mobile phones and tablet computers.

The application processor 230 may be electrically connected to the package substrate 210 through a solder ball 220 disposed on the package substrate 210. The memory chip 250 may be electrically connected to the application processor 230 through a solder ball 240 disposed on the application processor 230. The application processor 230 may be mounted on the package substrate 210 such that an active surface of the application processor 230 may face the package substrate 210 or the memory chip 250. The memory chip 250 may be stacked on the application processor 230 such that an active surface of the memory chip 250 may face the application processor 230. The application processor 230 may include a through electrode 235. For example, the application processor may have a structure which is the same as or different from that of the semiconductor device depicted in FIGS. 1 to 6 or FIGS. 7 to 9. The description of the semiconductor device depicted in FIGS. 1 to 6 or FIGS. 7 to 9 may be applicable to the application processor 230.

Figure 11:
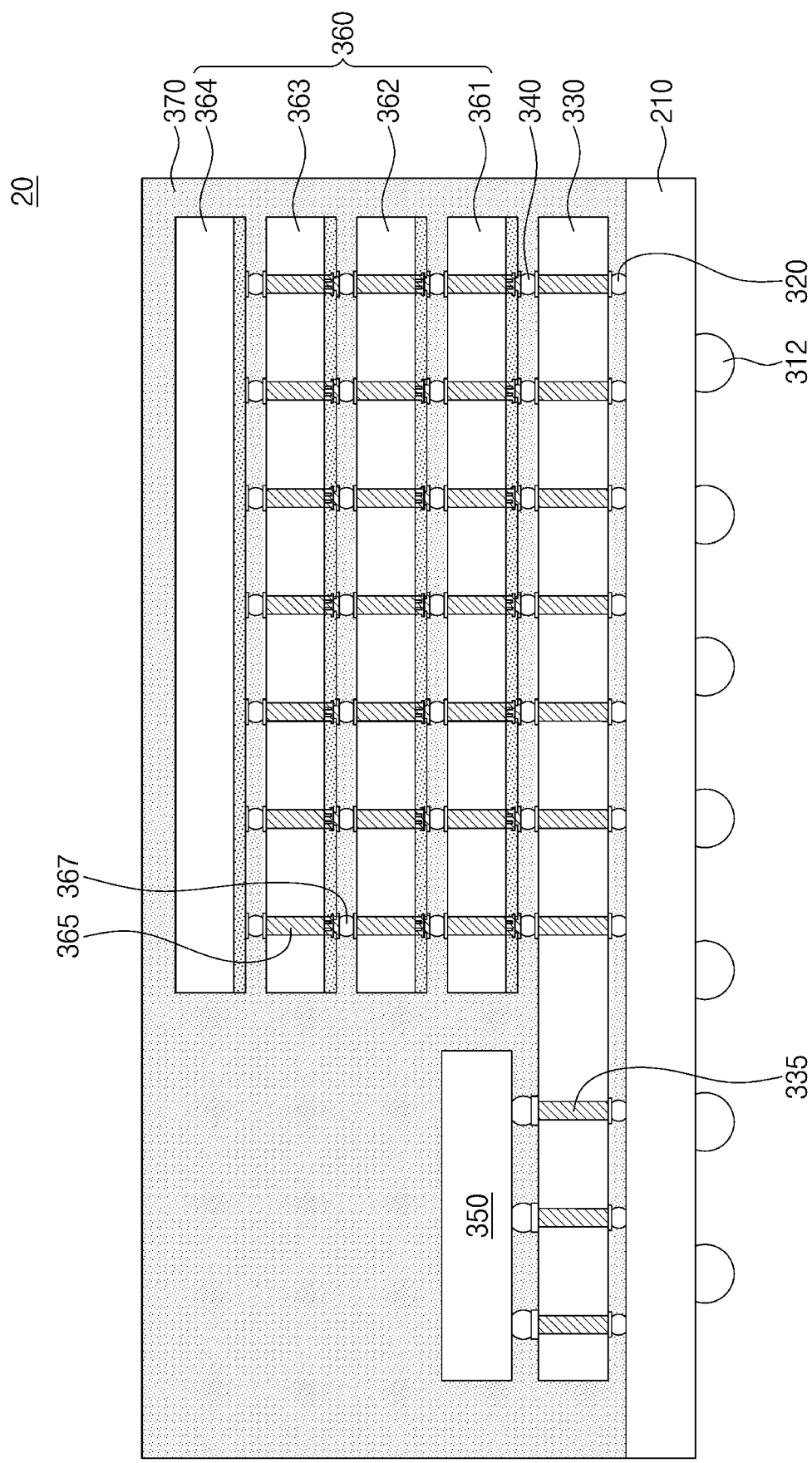
FIG. 11 illustrates a cross-sectional view showing a semiconductor module including a semiconductor device according to some example embodiments of the present inventive concepts.

FIG. 11 illustrates a cross-sectional view showing a semiconductor module including a semiconductor device according to some example embodiments of the present inventive concepts.

Referring to FIG. 11, a semiconductor module 20 may be, for example, a memory module that includes a package substrate 310 such as a printed circuit board having an external terminal 312 attached thereto, a chip stack 360 and a graphic processing unit (GPU) 350 that are mounted on the package substrate 310, and a mold layer 370 that covers the chip stack 360 and the graphic processing unit 350. The semiconductor module 20 may further include an interposer 330 provided on the package substrate 310.

The graphic processing unit 350 and the chip stack 360 may be electrically connected to the interposer 330 through solder balls 340 disposed on the interposer 330. The interposer 330 may include a through electrode 335 and may be electrically connected to the package substrate 310 through a solder ball 320 disposed on the package substrate 310.

The chip stack 360 may include a plurality of high-bandwidth memory chips 361, 362, 363, and 364 that are stacked on each other. The memory chips 361, 362, 363, and 364 may be electrically connected with each other through solder balls 367. At least one of the memory chips 361, 362, 363, and 364 may include a through electrode 365. For example, each of first, second, and third memory chips 361, 362, and 363 may include at least one through electrode 365. A fourth memory chip 364 may include no through electrode. Alternatively, the fourth memory chip 364 may include a through electrode 365. Among the memory chips 361, 362, 363, and 364, at least the first, second, and third memory chips 361, 362, and 363 may have a structure which is the same as or similar to that of the semiconductor device depicted in FIGS. 1 to 6 or FIGS. 7 to 9. The description of the semiconductor device depicted in FIGS. 1 to 6 or FIGS. 7 to 9 may be applicable to the first, second, and third memory chips 361, 362, and 363.

FIGS. 12 to 19 illustrate cross-sectional views showing a method of fabricating a semiconductor device according to some example embodiments of the present inventive concepts.

Figure 12:
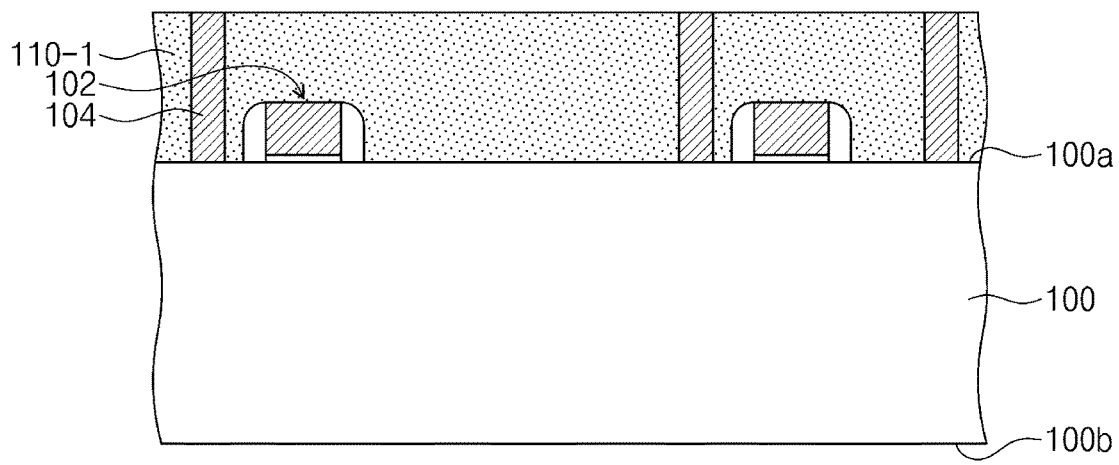
FIGS. 12 to 19 illustrate cross-sectional views showing a method of fabricating a semiconductor device according to some example embodiments of the present inventive concepts.

Referring to FIG. 12, a substrate 100 may be provided. The substrate 100 may have a top surface 100a and a bottom surface 100b opposite to the top surface 100a. The substrate 100 may include or may be formed of a semiconductor substrate, such as a silicon (Si) substrate.

A first dielectric layer 110-1 including an integrated circuit 102 may be formed on the top surface 100a of the substrate 100. The integrated circuit 102 may include a memory circuit, a logic circuit, or a combination thereof. The first dielectric layer 110-1 may be formed of a silicon oxide (SiO) layer or a silicon nitride (SiN) layer. For example, the first dielectric layer 110-1 may be formed of a tetraethyl orthosilicate (TEOS) oxide layer formed by chemical vapor deposition (CVD). The first dielectric layer 110-1 may be patterned and a conductor may be deposited to form one or more contacts 104 that penetrate the first dielectric layer 110-1. The contacts 104 may be in contact with the substrate 100 or may be electrically connected to the substrate 100 or the integrated circuit 102.

Figure 13:
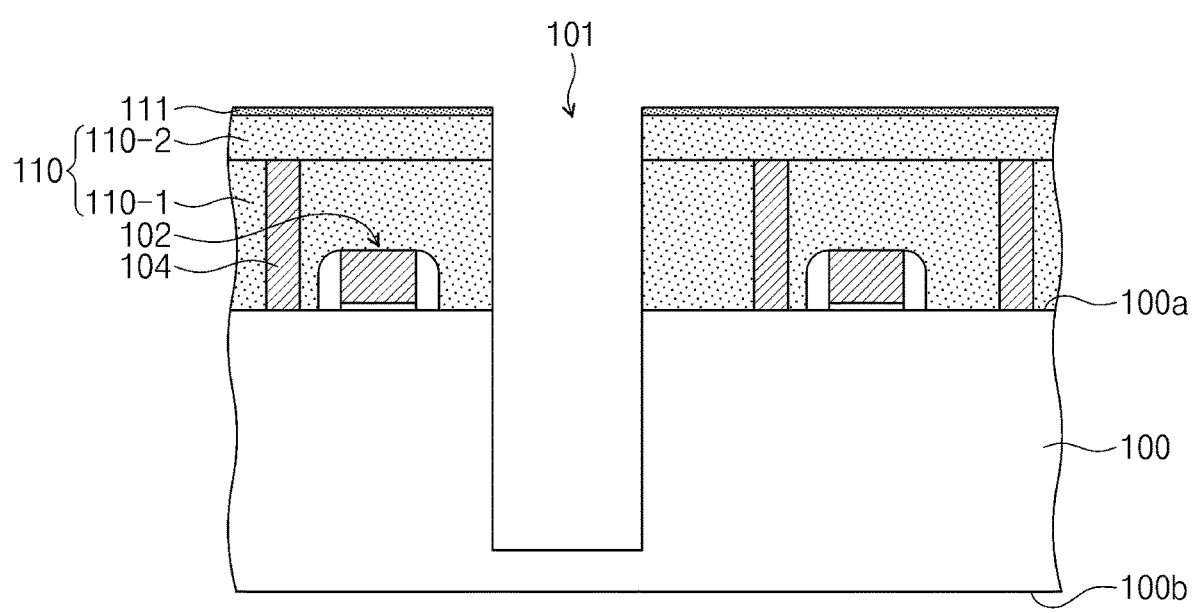

Referring to FIG. 13, a second dielectric layer 110-2 may be formed on the first dielectric layer 110-1. The second dielectric layer 110-2 may be formed identically or similarly to the first dielectric layer 110-1. For example, the second dielectric layer 110-2 may include or may be formed of a tetraethyl ortho silicate (TEOS) oxide layer formed by chemical vapor deposition (CVD). The first and second dielectric layers 110-1 and 110-2 may constitute an interlayer dielectric layer 110 in which the integrated circuit 102 and the contacts 104 are buried.

A polishing stop layer 111 may be formed on the second dielectric layer 110-2. The polishing stop layer 111 may be formed of a material different from that of the second dielectric layer 110-2. For example, the polishing stop layer 111 may include or may be formed of a silicon nitride (SiN) layer formed by chemical vapor deposition (CVD).

Photolithography and etching processes may be performed to form a via hole 101 that vertically penetrates the polishing stop layer 111, the interlayer dielectric layer 110, and the substrate 100. The via hole 101 may completely penetrate the polishing stop layer 111 and the interlayer dielectric layer 110. In some embodiments, the via hole 101 may penetrate a portion of the substrate 100 and may not reach the bottom surface 100b of the substrate 100.

Figure 14:
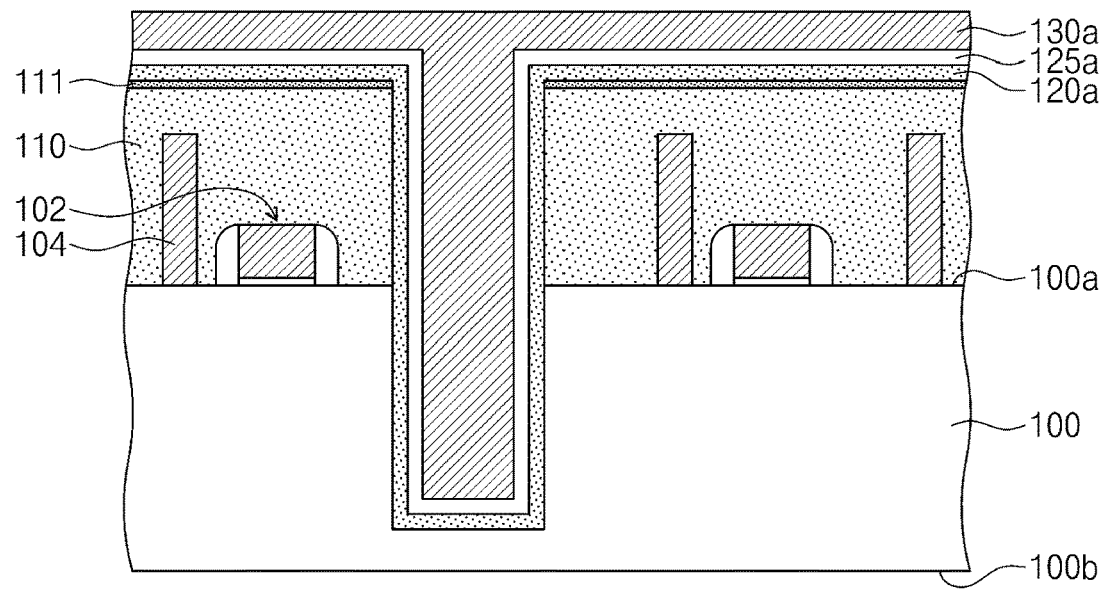

Referring to FIG. 14, a dielectric layer 120a may be formed to cover an inner wall of the via hole 101 and a top surface of the polishing stop layer 111. The dielectric layer 120a may be formed of a high-aspect-ratio process (HARP) layer that is deposited by sub-atmospheric chemical vapor deposition (SACVD).

A conductive layer 130a may be formed on the substrate 100, thereby filling the via hole 101. The conductive layer 130a may be formed by depositing or plating polycrystalline silicon (Si), copper (Cu), tungsten (W), and/or aluminum (Al).

When the conductive layer 130a is formed of copper or conductor including copper, a metal layer 125a that can prevent diffusion of copper may further be formed on the dielectric layer 120a. The metal layer 125a may be formed by depositing a metallic or conductive material, such as titanium (Ti), titanium nitride (TiN), chromium (Cr), tantalum (Ta), tantalum nitride (TaN), nickel (Ni), tungsten nitride (WN), and any combination thereof, and may have a shape that extends along the dielectric layer 120a.

Figure 15:
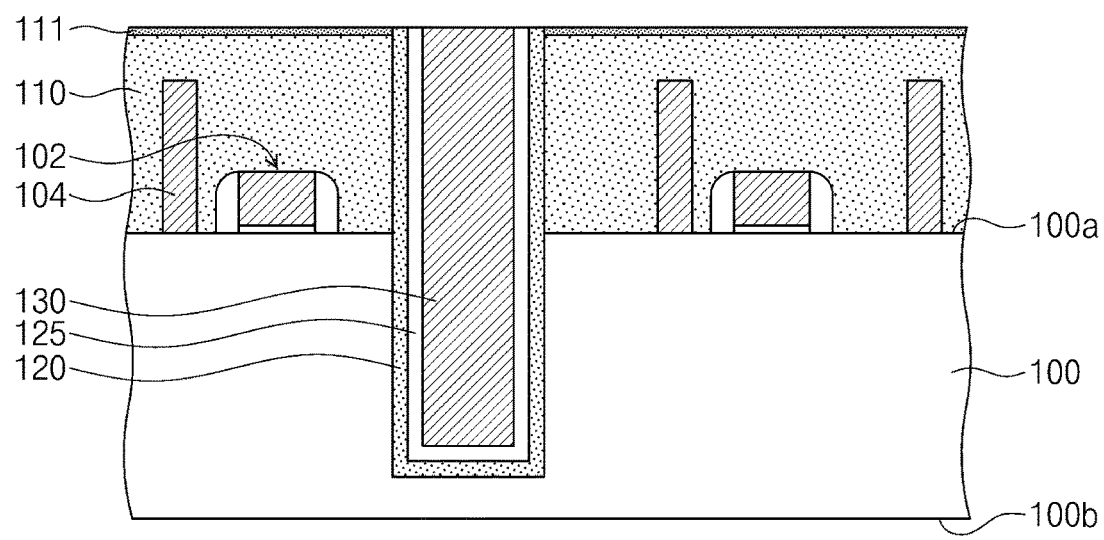

Referring to FIG. 15, a chemical mechanical polishing (CMP) process may be used to planarize the conductive layer 130a. The chemical mechanical polishing process may continue until the polishing stop layer 111 is exposed. In the planarization process, the dielectric layer 120 and the metal layer 125a may be polished together with the conductive layer 130a. The planarization process may convert the conductive layer 130a into a pillar-shaped through electrode 130 that fills the via hole 101, and may also convert the dielectric layer 120a into a cup-shaped via dielectric layer 120 that surrounds an outer sidewall and a bottom surface of the through electrode 130. When the metal layer 125a is further formed, the planarization process may convert the metal layer 125a into a barrier layer 125 that prevents the substrate 100 or the integrated circuit 102 from being contaminated with constituents (e.g., copper (Cu)) of the through electrode 130.

Figure 16:
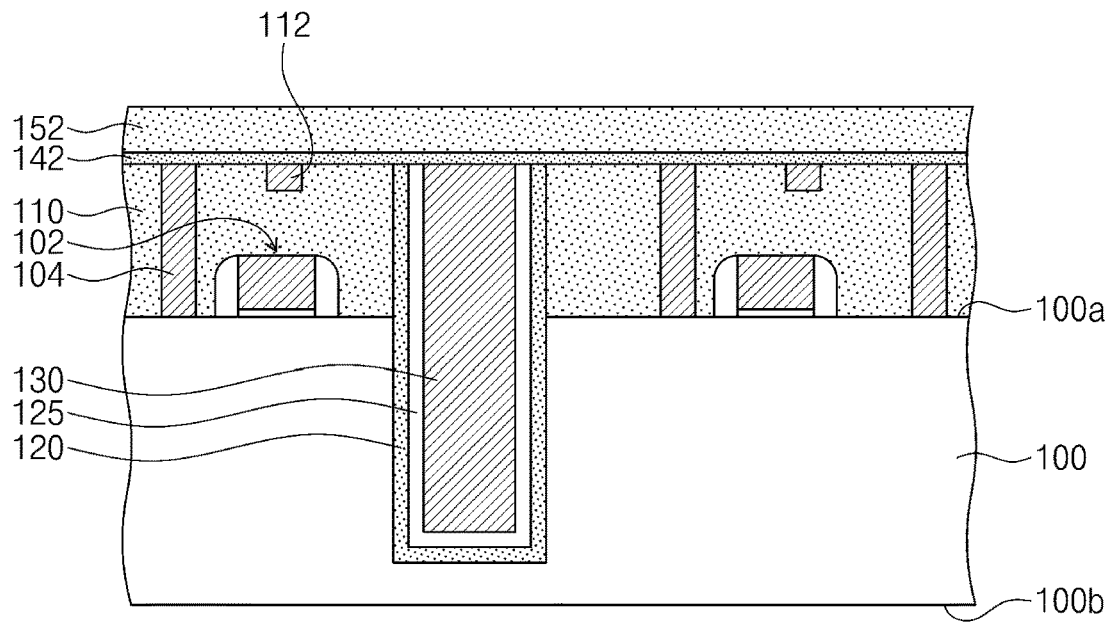

Referring to FIG. 16, the polishing stop layer 111 may be selectively removed. For example, the polishing stop layer 111 may be removed from the substrate 100 by performing an etching process using an etchant that selectively removes the polishing stop layer 111. The removal of the polishing stop layer 111 may expose the through electrode 130 and a top surface of the interlayer dielectric layer 110. The through electrode 130 may protrude beyond the top surface of the interlayer dielectric layer 110.

An internal wiring pattern 112 may be formed in the interlayer dielectric layer 110. The internal wiring pattern 112 may include or may be formed of metal, such as copper (Cu), tungsten (W), aluminum (Al), and any combination thereof. In some embodiments, the internal wiring pattern 112 may include or may be formed of copper formed by a damascene process. When the internal wiring pattern 112 is formed, a portion of the through electrode 130 may be removed. The portion of the through electrode 130 may protrude upwardly from the top surface of the interlayer dielectric layer 110. Therefore, the through electrode 130 may have a top surface coplanar with that of the interlayer dielectric layer 110 and/or that of the internal wiring pattern 112.

A first capping layer 142 may be formed to cover the interlayer dielectric layer 110. The first capping layer 142 may cover the through electrode 130, the contact 104, and the internal wiring pattern 112. For example, identically or similarly to the polishing stop layer 111, the first capping layer 142 may include or may be formed of a silicon nitride (SiN) layer formed by chemical vapor deposition (CVD). Alternatively, the first capping layer 142 may include or may be formed of a dielectric material (e.g., silicon carbonitride (SiCN)) having a low dielectric constant that can prevent diffusion of metallic components included in the contact 104 and/or the internal wiring pattern 112.

A first intermetal dielectric layer 152 may be formed on the first capping layer 142. Identically or similarly to the interlayer dielectric layer 110, the first intermetal dielectric layer 152 may include or may be formed of a tetraethyl orthosilicate (TEOS) oxide layer formed by chemical vapor deposition (CVD).

Figure 17:
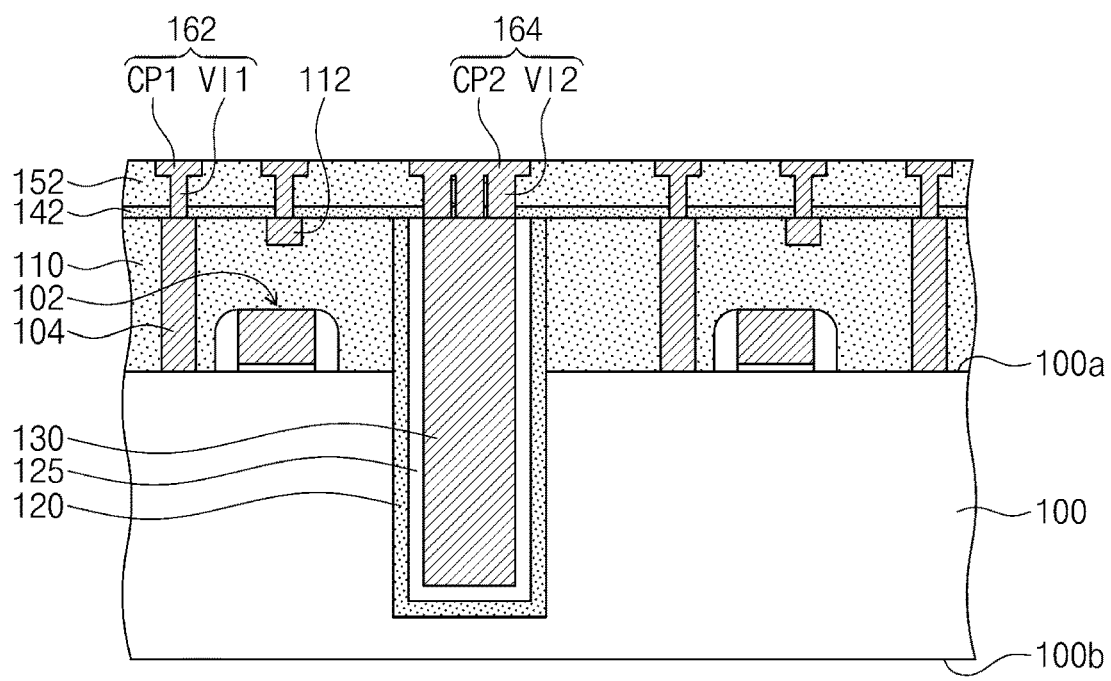

Referring to FIG. 17, in the first intermetal dielectric layer 152, a first wiring pattern 162 may be formed to have connection with the contact 104 or the internal wiring pattern 112, and a second wiring pattern 164 may be formed to have connection with the through electrode 130. The first wiring pattern 162 and the second wiring pattern 164 may include or may be formed of metal, such as copper (Cu), tungsten (W), aluminum (Al), and any combination thereof. For example, the first and second wiring patterns 162 and 164 may include or may be formed of copper formed by a damascene process. For example, the first wiring pattern 162 may include a first conductive pattern CP1 that constitutes a horizontal redistribution layer in the first intermetal dielectric layer 152, and may also include a first via VI1 that vertically penetrates the first intermetal dielectric layer 152 and the first capping layer 142 and has connection with a bottom surface of the first conductive pattern CP1. For example, the second wiring pattern 164 may include a second conductive pattern CP2 that constitutes a horizontal redistribution layer in the first intermetal dielectric layer 152, and may also include a second via VI2 that vertically penetrates the first intermetal dielectric layer 152 and the first capping layer 142 and has connection with a bottom surface of the second conductive pattern CP2. According to some embodiments, the second wiring pattern 164 may be formed to have electrical connection with the through electrode 130 through two or more second vias VI2. The first and second wiring patterns 162 and 164 may be formed by, for example, a dual damascene process. The second via VI2 may be formed to have a bar shape that extends in a second direction (see D2 of FIGS. 1 to 3).

The above processes may form a first wiring layer RL1 that includes the first capping layer 142, the first intermetal dielectric layer 152, the first wiring pattern 162, and the second wiring pattern 164.

Figure 18:
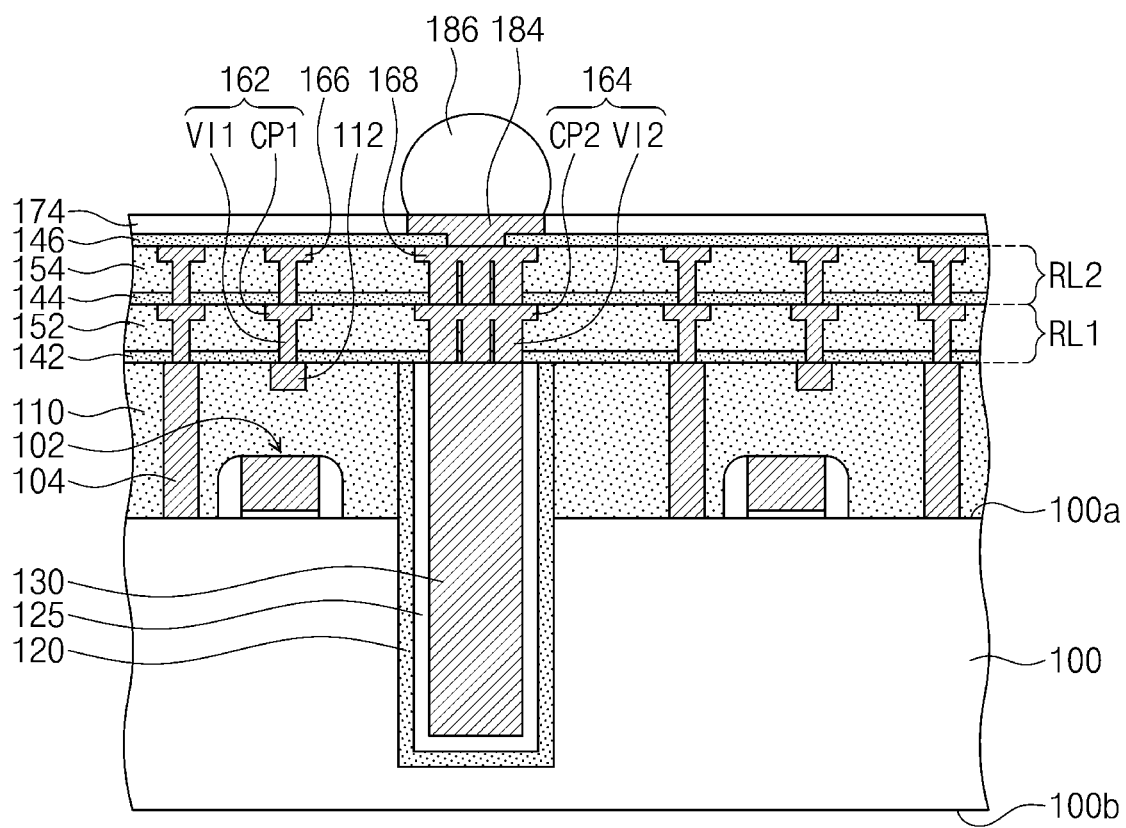

Referring to FIG. 18, a second wiring layer RL2 may be formed on the first wiring layer RL1. For example, a second capping layer 144, a second intermetal dielectric layer 154, a third wiring pattern 166, a fourth wiring pattern 168, and a third capping layer 146 may be sequentially formed on the first intermetal dielectric layer 152. The second and third capping layers 144 and 146 may be formed by a method which is the same as or similar to that used for forming the first capping layer 142. For example, the second and third capping layers 144 and 146 may include or may be formed of a silicon nitride (SiN) layer formed by chemical vapor deposition (CVD). The second intermetal dielectric layer 154 may be formed by a method which is the same as or similar to that used for forming the first intermetal dielectric layer 152. For example, the second intermetal dielectric layer 154 may include or may be formed of a tetraethyl orthosilicate (TEOS) oxide layer formed by chemical vapor deposition (CVD). The third and fourth wiring patterns 166 and 168 may be formed by a method which is the same as or similar to that used for forming the first and second wiring patterns 162 and 164. For example, the third and fourth wiring patterns 166 and 168 may include or may be formed of copper formed by a damascene process. A via of the fourth wiring pattern 168 may be formed to have a bar shape that extends in the second direction D2.

The above processes may form a second wiring layer RL2 that includes the second capping layer 144, the second intermetal dielectric layer 154, the third wiring pattern 166, and the fourth wiring pattern 168. The third capping layer 146 may be formed on the second wiring layer RL2.

On the second wiring layer RL2, an upper passivation layer 174 may be formed to cover the third capping layer 146, and an upper pad 184 may be formed to have electrical connection with the fourth wiring pattern 168. For example, the upper passivation layer 174 may be formed by depositing a dielectric material, such as a silicon oxide (SiO) layer, a silicon nitride (SiN) layer, and a polymer. The upper pad 184 may be formed of, for example, copper (Cu).

An upper terminal 186 may be formed on the upper passivation layer 174 for electrical connection with the upper pad 184. For example, the upper terminal 186 may include or may be formed of a solder ball. The upper terminal 186 may be formed of lead-free solder.

Figure 19:
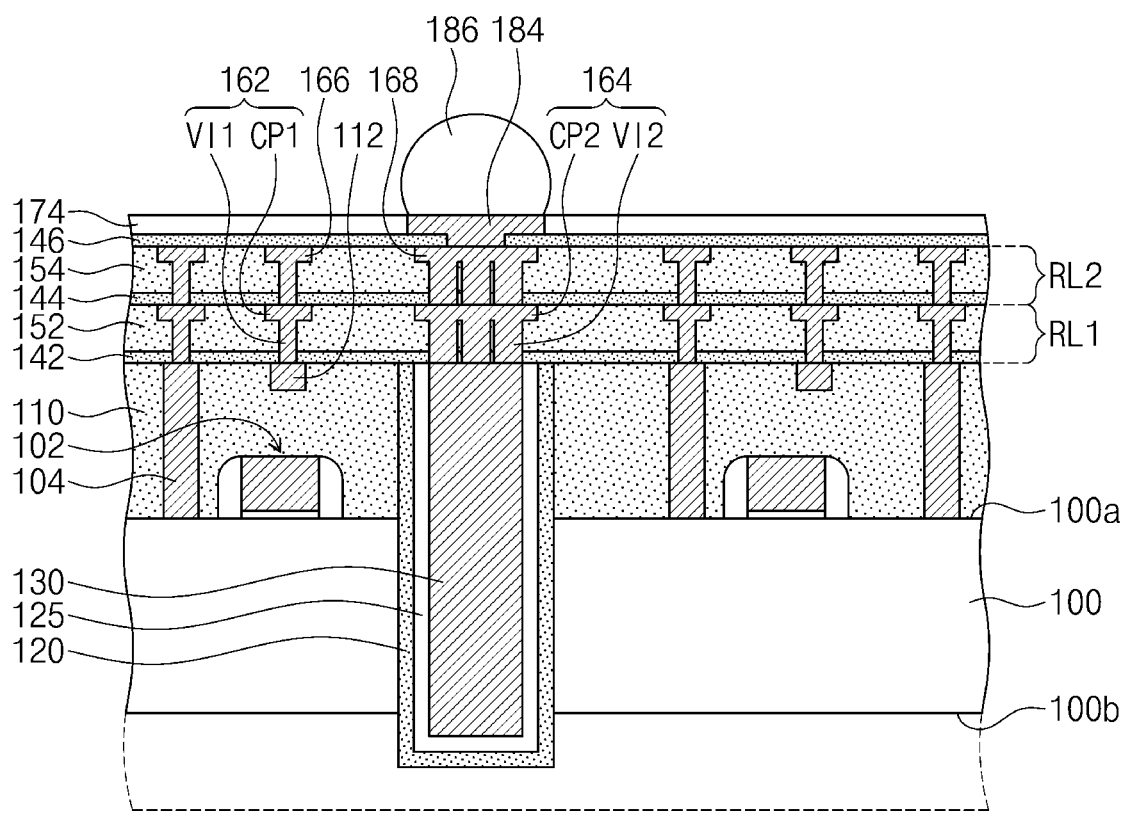

Referring to FIG. 19, the substrate 100 may be recessed such that the through electrode 130 may protrude. For example, the bottom surface 100b of the substrate 100 may be recessed by an etching process using an etchant that can selectively remove a material (e.g., silicon (Si)) of the substrate 100, a chemical mechanical polishing (CMP) process, a grinding process, or any combination thereof. The recess process may continue until the through electrode 130 is exposed at the bottom surface 100b of the substrate 100. For example, a chemical mechanical polishing (CMP) process may be performed such that the through electrode 130 is not exposed at the bottom surface 100b of the substrate 100, and thereafter a dry etching process may be performed such that the through electrode 130 may be exposed at the bottom surface 100b of the substrate 100.

Referring back to FIG. 3, a lower passivation layer 172 may be formed to cover the bottom surface 100b of the substrate 100. For example, the lower passivation layer 172 may be formed by depositing a dielectric material, such as a silicon oxide (SiO) layer, a silicon nitride (SiN) layer, and a polymer.

A lower pad 182 may be formed on the lower passivation layer 172, thereby being electrically connected to the through electrode 130. For example, the lower pad 182 may be formed of copper (Cu). Differently from that shown in FIG. 3, the lower pad 182 may be shaped like a solder ball.

The processes mentioned above may fabricate the semiconductor device discussed with reference to FIGS. 1 to 4.

A semiconductor device according to some embodiments of the present inventive concepts may be configured such that a plurality of vias between a through electrode and a conductive pattern may have a large width along an extending direction of the conductive pattern. Therefore, the plurality of vias may have a large cross-section and a low resistance. The plurality of vias and the conductive pattern may have therebetween a large area and a low contact resistance. As a result, the semiconductor device may improve in electrical characteristics. For example, a contact resistance between the conducive pattern and the plurality of vias may be reduced.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
a substrate provided with an integrated circuit and a contact electrically connected to the integrated circuit;
an interlayer dielectric layer on the substrate, the interlayer dielectric layer covering the integrated circuit and the contact;
a through electrode penetrating the substrate and the interlayer dielectric layer;
a first intermetal dielectric layer on the interlayer dielectric layer; and
a first wiring pattern and a second wiring pattern in the first intermetal dielectric layer,
wherein the first wiring pattern includes:
a first conductive pattern on the through electrode; and
a first via vertically penetrating the first intermetal dielectric layer and connecting the first conductive pattern to the through electrode,
wherein the first via is interposed between the first conductive pattern and the through electrode,
wherein the second wiring pattern includes:
a second conductive pattern on the contact; and
a second via vertically penetrating the first intermetal dielectric layer and connecting the second conductive pattern to the contact, and wherein a first width, in a first direction, of the first via is greater than a second width, in the first direction, of the second via, the first direction being parallel to a top surface of the interlayer dielectric layer.

2. The semiconductor device of claim 1,
wherein the first width is about 2 times to about 50 times the second width.

3. The semiconductor device of claim 1,
wherein an aspect ratio of the first via is greater than an aspect ratio of the second via,
wherein the aspect ratio of the first via is a ratio of the first width, in the first direction, of the first via to a third width, in a second direction, of the first via,
wherein the aspect ratio of the second via is a ratio of the second width, in the first direction, of the second via to a fourth width, in the second direction, of the second via, and
wherein the second direction is different from the first direction and is parallel to the top surface of the interlayer dielectric layer.

4. The semiconductor device of claim 1,
wherein the first via has a bar shape that extends in the first direction,
wherein the first via has a third width in a second direction,
wherein the second direction intersects the first direction and is parallel to the top surface of the interlayer dielectric layer, and
wherein the first width of the first via is greater than the third width of the first via.

5. The semiconductor device of claim 4,
wherein the first width is about 2 times to about 100 times the third width.

6. The semiconductor device of claim 1,
wherein a width, in the first direction, of the first conductive pattern is greater than the first width, in the first direction, of the first via.

7. The semiconductor device of claim 1,
wherein the first via is provided in plural,
wherein the plurality of first vias are arranged in the first direction and a second direction, and
wherein the second direction intersects the first direction and is parallel to the top surface of the interlayer dielectric layer.

8. The semiconductor device of claim 7,
wherein, when viewed in a plan view, the first conductive pattern has a mesh shape that connects the plurality of first vias with each other.

9. The semiconductor device of claim 7,
wherein at least two first vias of the plurality of first vias are connected to each other in the first direction to form a single row extending in the first direction.

10. The semiconductor device of claim 1, further comprising:
a capping layer covering the interlayer dielectric layer and the through electrode,
wherein the first intermetal dielectric layer is on the capping layer,
wherein the first via vertically penetrates the first intermetal dielectric layer and the capping layer and connects the first conductive pattern to the through electrode, and
wherein the second via vertically penetrates the first intermetal dielectric layer and the capping layer and connects the second conductive pattern to the contact.

11. The semiconductor device of claim 1, further comprising:
a second intermetal dielectric layer on the first intermetal dielectric layer; and
a third wiring pattern in the second intermetal dielectric layer,
wherein the third wiring pattern includes:
a third conductive pattern on the through electrode; and
a third via vertically penetrating the second intermetal dielectric layer and being connected to the first wiring pattern, and
wherein the third via has a bar shape that extends in the first direction.

* * * * *